(12) United States Patent
Sasaki

(10) Patent No.: US 12,500,099 B2
(45) Date of Patent: Dec. 16, 2025

(54) SUBSTRATE PROCESSING APPARATUS AND SUBSTRATE PROCESSING METHOD

(71) Applicant: SCREEN Holdings Co., Ltd., Kyoto (JP)

(72) Inventor: Mitsutoshi Sasaki, Kyoto (JP)

(73) Assignee: SCREEN Holdings Co., Ltd., Kyoto (JP)

( * ) Notice: Subject to any disclaimer, the term of this patent is extended or adjusted under 35 U.S.C. 154(b) by 216 days.

(21) Appl. No.: 18/161,888

(22) Filed: Jan. 31, 2023

(65) Prior Publication Data

US 2023/0241644 A1    Aug. 3, 2023

(30) Foreign Application Priority Data

Feb. 1, 2022 (JP) ................................ 2022-014546

(51) Int. Cl.
*H01L 21/67* (2006.01)
*H01L 21/677* (2006.01)

(52) U.S. Cl.
CPC .. *H01L 21/67086* (2013.01); *H01L 21/67057* (2013.01); *H01L 21/67757* (2013.01)

(58) Field of Classification Search
None
See application file for complete search history.

(56) References Cited

U.S. PATENT DOCUMENTS

| | | | |
|---|---|---|---|
| 11,309,194 B2 | 4/2022 | Tanaka et al. | |
| 2002/0092547 A1 | 7/2002 | You et al. | |
| 2004/0094268 A1* | 5/2004 | Brask | H01L 21/67086 216/90 |
| 2005/0155976 A1* | 7/2005 | Hua | H01L 21/67057 220/826 |
| 2005/0201747 A1 | 9/2005 | You et al. | |
| 2006/0096613 A1 | 5/2006 | You et al. | |
| 2006/0118140 A1* | 6/2006 | Nishimura | B08B 3/10 134/94.1 |
| 2013/0233354 A1* | 9/2013 | Miura | H01L 21/67057 134/29 |
| 2013/0306238 A1 | 11/2013 | Miura et al. | |

(Continued)

FOREIGN PATENT DOCUMENTS

| | | |
|---|---|---|
| JP | H0497525 | 3/1992 |
| JP | 2013258391 | 12/2013 |

(Continued)

*Primary Examiner* — Keath T Chen
*Assistant Examiner* — Margaret Klunk
(74) *Attorney, Agent, or Firm* — JCIPRNET

(57) ABSTRACT

A substrate processing apparatus includes a processing bath, a first lid member, an outer bath, a processing liquid introduction unit, a first gas supply unit, and a second gas supply unit. The processing bath stores a processing liquid in which a substrate is immersed. The first lid member covers an upper opening of the processing bath. The outer bath is provided outside of the processing bath and a processing liquid overflowing out of the processing liquid from the processing bath flows into the outer bath. The processing liquid introduction unit is able to introduce the processing liquid stored in the outer bath into the processing bath. The first gas supply unit supplies a first inert gas to the processing liquid stored in the processing bath. The second gas supply unit supplies a second inert gas into the outer bath.

11 Claims, 20 Drawing Sheets

(56) References Cited

U.S. PATENT DOCUMENTS

| | | | |
|---|---|---|---|
| 2017/0294323 A1 | 10/2017 | Miura et al. | |
| 2018/0218924 A1* | 8/2018 | Tanaka | H01L 21/67757 |
| 2019/0103294 A1 | 4/2019 | Masutomi et al. | |
| 2019/0172734 A1* | 6/2019 | Honda | H01L 21/67253 |
| 2019/0371595 A1 | 12/2019 | Honda et al. | |
| 2020/0098597 A1 | 3/2020 | Takahashi et al. | |
| 2021/0313191 A1 | 10/2021 | Negoro et al. | |
| 2021/0327729 A1 | 10/2021 | Takahashi et al. | |

FOREIGN PATENT DOCUMENTS

| | | |
|---|---|---|
| JP | 2019067995 | 4/2019 |
| JP | 2019212652 | 12/2019 |
| JP | 2020038956 | 3/2020 |
| JP | 2020047885 | 3/2020 |
| JP | 2022077385 | 5/2022 |
| KR | 1020020061031 | 7/2002 |
| KR | 20180089864 | 8/2018 |
| KR | 1020190039463 | 4/2019 |
| KR | 20210124425 | 10/2021 |
| WO | 2020105403 | 5/2020 |
| WO | 2020171124 | 8/2020 |

* cited by examiner

SUBSTRATE PROCESSING APPARATUS AND SUBSTRATE PROCESSING METHOD

CROSS-REFERENCE TO RELATED APPLICATION

This application claims priority under 35 U.S.C § 119 to Japanese Patent Application No. 2022-14546, filed Feb. 1, 2022. Each of the above application(s) is hereby expressly incorporated by reference, in its entirety, into the present application.

BACKGROUND

Technical Field

The present disclosure relates to substrate processing apparatus and a substrate processing method.

Description of Related Art

Substrate processing apparatus described in Patent Document 1 (Japanese Patent Laid-Open No. 2020-47885) includes a processing bath, a substrate holding unit, a fluid supply unit, and a control unit. The processing bath stores a processing liquid for processing a substrate. The substrate holding unit holds the substrate in the processing liquid in the processing bath. The fluid supply unit supplies a fluid to the processing bath. The fluid is a gas. The control unit controls the fluid supply unit. The control unit controls the fluid supply unit such that the fluid supply unit changes supply of the fluid after supply of the fluid to the processing bath storing the processing liquid in which the substrate is immersed starts and until supply of the fluid to the processing bath storing the processing liquid in which the substrate is immersed ends.

However, in the substrate processing apparatus described in Patent Document 1, bubbles are merely formed in the processing liquid stored in an inner bath by causing the fluid supply unit to supply an inert gas to the inner bath of the processing bath. Accordingly, effectiveness of the inert gas is limited.

Therefore, the inventors of the present disclosure have repeatedly studied technology capable of enhancing the effectiveness of an inert gas and effectively processing a substrate.

SUMMARY

The present disclosure provides a substrate processing apparatus and a substrate processing method that can enhance the effectiveness of an inert gas and effectively process a substrate.

A substrate processing apparatus according to an aspect of the present disclosure includes a processing bath, a first lid member, an outer bath, a processing liquid introduction unit, a first gas supply unit, and a second gas supply unit. The processing bath stores a processing liquid in which a substrate is immersed. The first lid member covers an upper opening of the processing bath. The outer bath is provided outside of the processing bath and a processing liquid overflowing out of the processing liquid from the processing bath flows into the outer bath. The processing liquid introduction unit is able to introduce the processing liquid stored in the outer bath into the processing bath. The first gas supply unit supplies a first inert gas to the processing liquid stored in the processing bath. The second gas supply unit supplies a second inert gas into the outer bath.

In the aspect of the present disclosure, the substrate processing apparatus may further include a substrate holding unit. The substrate holding unit may hold a plurality of substrates in a predetermined direction and immerse the plurality of substrates in the processing liquid stored in the processing bath. The processing bath may include a pair of side walls extending in the predetermined direction. The first lid member may include a contact section that comes into contact with the processing liquid. The contact section may be separated from the plurality of substrates. The contact section may include a first tilted portion and a second tilted portion. The first tilted portion may be tilted obliquely upward from a position facing a top of the plurality of substrates to one side wall of the pair of side walls in a state in which the first lid member covers the upper opening of the processing bath. The second tilted portion may be tilted obliquely upward from the position facing the top of the plurality of substrates to the other side wall of the pair of side walls in the state in which the first lid member covers the upper opening of the processing bath.

In the aspect of the disclosure, the second gas supply unit may be provided in the outer bath and eject the second inert gas downward.

In the aspect of the disclosure, the second gas supply unit may be provided in the outer bath and eject the second inert gas upward.

In the aspect of the disclosure, the substrate processing apparatus may further include a gas flow rate adjusting unit and a first control unit. The gas flow rate adjusting unit may adjust a flow rate of the first inert gas. The first control unit may control the gas flow rate adjusting unit. The first control unit may control the gas flow rate adjusting unit such that the flow rate of the first inert gas in a period in which the substrate is not immersed in the processing liquid is higher than the flow rate of the first inert gas in a period in which the substrate is immersed in the processing liquid.

In the aspect of the disclosure, the first control unit may control the gas flow rate adjusting unit such that the flow rate of the first inert gas in the period in which the substrate is not immersed in the processing liquid is a maximum flow rate.

In the aspect of the disclosure, the processing liquid introduction unit may include: a pipe and a pump. The pipe may connect the outer bath and the processing bath and allow the processing liquid to flow therein. The pump may pump out the processing liquid from the outer bath to the processing bath via the pipe. The substrate processing apparatus may further include a second control unit that controls the pump. The second control unit may control the pump such that a flow rate of the processing liquid flowing in the pipe in a period in which the substrate is immersed in the processing liquid is less than a flow rate of the processing liquid flowing in the pipe in a period in which the substrate is not immersed in the processing liquid.

In the aspect of the disclosure, the second control unit may stop the pump in the period in which the substrate is immersed in the processing liquid.

In the aspect of the disclosure, the second control unit may control the pump such that the flow rate of the processing liquid flowing in the pipe in the period in which the substrate is not immersed in the processing liquid is a maximum flow rate.

In the aspect of the disclosure, the substrate processing apparatus may further include a second lid member. The second lid member may cover an upper opening of the outer bath. The first lid member may cover the upper opening of the processing bath and the second lid member.

In the aspect of the disclosure, the processing liquid may be alkaline.

A substrate processing method according to another aspect of the present disclosure is performed by substrate processing apparatus including a processing bath in which a processing liquid for processing a substrate is stored, an outer bath, into which a processing liquid overflowing out of the processing liquid from the processing bath flows, and a processing liquid introduction unit which is able to introduce the processing liquid stored in the outer bath into the processing bath. The substrate processing method includes a first gas supply step and a second gas supply step. In the first gas supply step, a first inert gas is supplied to the processing liquid stored in the processing bath. In the second gas supply step, a second inert gas is supplied into the outer bath.

DESCRIPTION OF THE EMBODIMENTS

Figure 1:
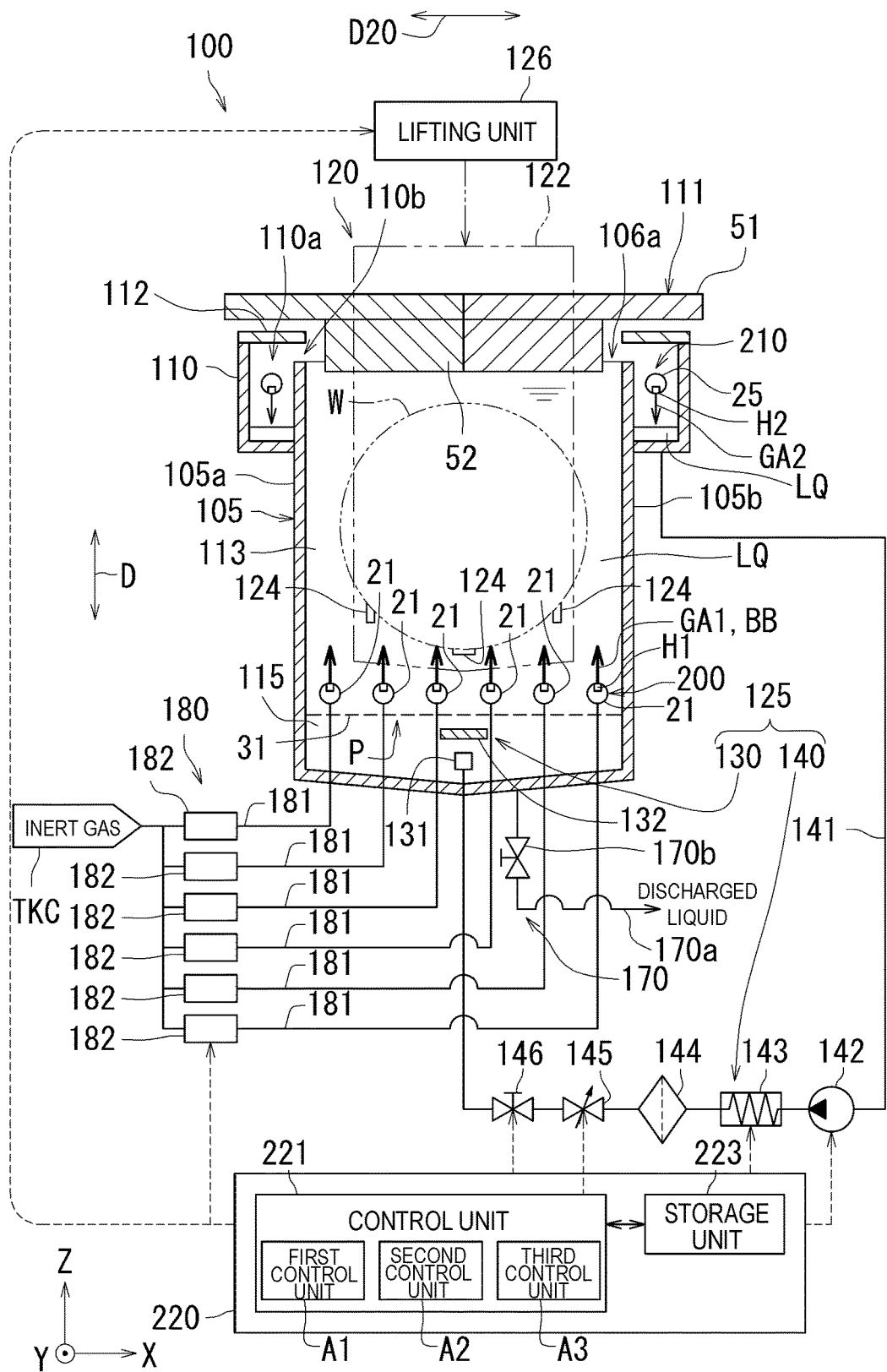
FIG. 1 is a sectional view schematically illustrating substrate processing apparatus according to an embodiment of the present disclosure.

Hereinafter, an embodiment of the present disclosure will be described with reference to the accompanying drawings. In the drawings, the same or corresponding parts will be referred to by the same reference signs and description thereof will not be repeated. In the drawings, an X axis, a Y axis, and a Z axis are appropriately illustrated for the purpose of easy understanding. The X axis, the Y axis, and the Z axis are perpendicular to each other, the X axis and the Y axis are parallel to the horizontal direction, and the Z axis is parallel to the vertical direction. A "top planar view" represents a view of a target from vertically above. A "bottom planar view" represents a view of a target from vertically below.

Substrate processing apparatus 100 according to an embodiment of the present disclosure will be described below with reference to FIGS. 1 to 15. The substrate processing apparatus 100 will be first described below with reference to FIG. 1. FIG. 1 is a sectional view schematically illustrating the substrate processing apparatus 100. The substrate processing apparatus 100 illustrated in FIG. 1 is of a batch type and processes a plurality of substrates W together using a processing liquid LQ. The substrate processing apparatus 100 may process a single substrate W.

The substrate processing apparatus 100 includes a processing bath 105, an outer bath 110, a first lid member 111, a second lid member 112, a substrate holding unit 120, a processing liquid introduction unit 125, a liquid discharge unit 170, a gas flow rate adjusting unit 180, a first gas supply unit 200, a second gas supply unit 210, and a control device 220.

The processing bath 105 stores a processing liquid LQ in which a plurality of substrates W are immersed. The processing bath 105 can accommodate the plurality of substrates W. The processing bath 105 allows the plurality of substrates W to be immersed in the processing liquid LQ and processes the plurality of substrates W. The processing liquid LQ is, for example, an etchant.

In this embodiment, for example, it is assumed that the processing liquid LQ is alkaline. The alkaline processing liquid LQ is, for example, an aqueous solution including tetramethyl ammonium hydroxide (TMAH), an aqueous solution including trimethyl-2-hydroxyethyl ammonium hydroxide (TMY), ammonium hydroxide (ammonium solution), or a mixed solution of ammonia and hydrogen peroxide (SC1). The alkaline processing liquid LQ is, for example, an alkaline etchant (hereinafter referred to as an "alkaline etchant").

The first lid member 111 covers an upper opening 106a of the processing bath 105. The upper opening 106a opens upward in a vertical direction D. The first lid member 111 is formed of, for example, a synthetic resin. For example, the first lid member 111 may be formed of polytetrafluoroethylene (PTFE). The first lid member 111 includes a separated section 51 and a contact section 52. The separated section 51 is separated from the processing liquid LQ in the processing bath 105 in a state in which the first lid member 111 is closed. The separated section 51 has, for example, substantially a panel shape. The contact section 52 is in contact with the processing liquid LQ from above the processing liquid LQ in the processing bath 105 in the state in which the first lid member 111 is closed. Specifically, a bottom of the contact section 52 is in contact with the processing liquid LQ in the processing bath 105 in the state in which the first lid member 111 is closed. In the example illustrated in FIG. 1, the bottom of the contact section 52 enters the processing bath 105 via the upper opening 106a and is immersed in the processing liquid LQ in the processing bath 105 in the state in which the first lid member 111 is closed. In the state in which the first lid member 111 is closed, the contact section 52 is separated from the plurality of substrates W in the vertical direction D. The contact section 52 has, for example, substantially a panel shape.

The outer bath 110 is provided outside of the processing bath 105. The outer bath 110 surrounds the processing bath 105. A processing liquid LQ overflowing from the processing bath 105 out of the processing liquid LQ stored in the processing bath 105 flows into the outer bath 110. The height of an upper edge of the outer bath 110 is higher than the height of an upper edge of the processing bath 105.

The second lid member 112 covers an upper opening 110a of the outer bath 110. The upper opening 110a opens upward in the vertical direction D. A gap 110b is interposed between the second lid member 112 and an upper end of the processing bath 105. The processing liquid LQ overflowing from the processing bath 105 flows into the outer bath 110 via the gap 110b. The second lid member 112 is formed of, for example, a synthetic resin. For example, the second lid member 112 may be formed of polytetrafluoroethylene (PTFE).

The substrate holding unit 120 holds a plurality of substrates W. The substrate holding unit 120 may hold a single substrate W. The substrate holding unit 120 immerses the plurality of substrates W arranged with an interval therebetween in the processing liquid LQ stored in the processing bath 105.

The processing liquid introduction unit 125 can introduce the processing liquid LQ stored in the outer bath 110 into the processing bath 105. The liquid discharge unit 170 discharges the processing liquid LQ in the processing bath 105.

The first gas supply unit 200 supplies a first inert gas GA1 to the processing liquid LQ stored in the processing bath 105. The first gas supply unit 200 is provided inside of the processing bath 105. The first inert gas GA1 is, for example, nitrogen or argon. Specifically, the first gas supply unit 200 supplies bubbles BB of the first inert gas GA1 to the processing liquid LQ stored in the processing bath 105.

Specifically, the first gas supply unit 200 includes at least one first gas supply pipe 21. In this embodiment, the first gas supply unit 200 includes a plurality of first gas supply pipes 21. The plurality of first gas supply pipes 21 are provided inside of the processing bath 105. The plurality of first gas supply pipes 21 are disposed on the bottom side of the processing bath 105. Each of the plurality of first gas supply pipes 21 includes a plurality of first ejection holes H1. Each of the plurality of first gas supply pipes 21 supplies bubbles BB from the first ejection holes H1 to the processing liquid LQ by ejecting the first inert gas GA1 from the plurality of first ejection holes H1. Specifically, each of the plurality of first gas supply pipes 21 supplies bubbles BB from the plurality of first ejection holes H1 to the processing liquid LQ from below the substrates W in a state in which the substrates W are immersed in the processing liquid LQ. Each first gas supply pipe 21 is, for example, a bubbler pipe. Each first gas supply pipe 21 is formed of, for example, quartz or a resin. The pipe diameter of each first gas supply pipe 21 is not particularly limited and is, for example, about 6.0 mm. The diameter of each first ejection hole H1 is not particularly limited, but is, for example, about 0.2 mm.

The gas flow rate adjusting unit 180 adjusts a flow rate of the first inert gas GA1 which is supplied to the first gas supply unit 200. Specifically, the gas flow rate adjusting unit 180 adjusts bubbles BB which are supplied to the processing liquid LQ by the first gas supply unit 200 by adjusting the flow rate of the first inert gas GA1 supplied to the first gas supply unit 200. More specifically, the gas flow rate adjusting unit 180 adjusts bubbles BB supplied to the processing liquid LQ from the plurality of ejection holes H1 by each first gas supply pipe 21 by adjusting the flow rate of the first inert gas GA1 supplied to the first gas supply pipe 21.

The second gas supply unit 210 supplies a second inert gas GA2 to the inside of the outer bath 110. The second gas supply unit 210 is disposed inside of the outer bath 110. The second inert gas GA2 is, for example, nitrogen or argon. In this embodiment, the second inert gas GA2 is the same as the first inert gas GA1. Specifically, the second gas supply unit 210 includes a second gas supply pipe 25. The second gas supply pipe 25 is disposed inside of the outer bath 110. The second gas supply pipe 25 includes a plurality of second ejection holes H2. The second gas supply pipe 25 supplies the second inert gas GA2 from the plurality of second ejection holes H2 to the inside of the outer bath 110. The second gas supply pipe 25 is formed of, for example, quartz or a resin. The pipe diameter of the second gas supply pipe 25 is not particularly limited and is, for example, about 6.0 mm. The diameter of each second ejection hole H2 is not particularly limited, but is, for example, about 0.2 mm.

The control device 220 controls the constituents of the substrate processing apparatus 100. Specifically, the control device 220 controls the first lid member 111, the substrate holding unit 120, the processing liquid introduction unit 125, the liquid discharge unit 170, the gas flow rate adjusting unit 180, and the second gas supply unit 210.

Specifically, the control device 220 includes a control unit 221 and a storage unit 223. The control unit 221 includes a processor such as a central processing unit (CPU). The storage unit 223 includes a storage device and stores data and computer programs. The processor of the control unit 221 controls the constituents of the substrate processing apparatus 100 by executing the computer programs stored in the storage device of the storage unit 223. For example, the storage unit 223 includes a main storage device such as a semiconductor device and an auxiliary storage device such as a semiconductor memory and a hard disk drive. The storage unit 223 may include a removable medium such as an optical disc. The storage unit 223 is, for example, a non-transitory computer-readable storage medium. The control device 220 may include an input device and a display device.

As described above with reference to FIG. 1, according to this embodiment, oxygen dissolved in the processing liquid LQ is replaced with the first inert gas GA1 by causing the first gas supply unit 200 to supply the first inert gas GA1 (bubbles BB) to the processing liquid LQ in the processing bath 105. Accordingly, it is possible to decrease a dissolved oxygen concentration of the processing liquid LQ in the processing bath 105 in comparison with a case in which the first inert gas GA1 is not supplied. As a result, it is possible to effectively process the substrates W immersed in the processing liquid LQ using the processing liquid LQ. That is, since the dissolved oxygen concentration of the processing liquid LQ is decreased by supplying the first inert gas GA1 (bubbles BB), it is possible to increase a processing degree of the substrates W using the processing liquid LQ in comparison with the case in which the first inert gas GA1 is not supplied. In this embodiment, for example, processing of the substrates W using the processing liquid LQ is etching of the substrates W. In this case, the processing degree of the substrates W using the processing liquid LQ is an etching degree of the substrates W. Accordingly, it is possible to increase the etching degree of the substrates W using the processing liquid LQ by supplying the first inert gas GA1 (bubbles BB).

When the processing liquid LQ is alkaline, particularly, when the dissolved oxygen concentration of the processing liquid LQ is decreased using the first inert gas GA1 (bubbles), it is possible to further increase the processing degree of the substrates W using the processing liquid LQ. As a result, it is possible to improve a throughput when the substrates W are processed.

Particularly, in this embodiment, since the second inert gas GA2 is supplied into the outer bath 110, it is possible to curb dissolving of oxygen in the processing liquid LQ in the outer bath 110. Accordingly, the processing liquid LQ with a lower dissolved oxygen concentration in comparison with a case in which the second inert gas GA2 is not supplied is introduced into the processing bath 105 from the outer bath 110 by the processing liquid introduction unit 125. As a result, it is possible to curb an "increase in dissolved oxygen concentration of the processing liquid LQ in the processing bath 105 due to the processing liquid LQ introduced from the outer bath 110." Accordingly, it is possible to more effectively process the substrates W immersed in the processing liquid LQ using the processing liquid LQ. That is, by supplying the second inert gas GA2 into the outer bath 110 in addition to supplying the first inert gas GA1 to the processing liquid LQ in the processing bath 105, it is possible to more effectively process the substrates W using the processing liquid LQ in comparison with a case in which only the first inert gas GA1 is used. In this way, it is possible to enhance effectiveness of inert gas and to effectively process the substrates W.

According to this embodiment, it is possible to effectively replace the processing liquid LQ in contact with the surfaces of the substrates W with a new processing liquid LQ by supplying the first inert gas GA1 (bubbles BB) to the processing liquid LQ. As a result, when a surface pattern including a recessed portion is formed on the surface of a substrate W, it is possible to effectively replace the processing liquid LQ in the recessed portion with the new processing liquid LQ due to the diffusion phenomenon. Accordingly, it is possible to effectively process (etch) walls of the recessed portion of the surface pattern from a shallow position to a deep position using the processing liquid LQ.

Preferably, the second gas supply unit 210 is disposed inside of the outer bath 110 and ejects the second inert gas GA2 downward from the second ejection holes H2. According to this preferable example, it is possible to effectively curb dissolving of oxygen in the processing liquid LQ stored in the outer bath 110. This is because the second inert gas GA2 is ejected to a liquid surface of the processing liquid LQ in the outer bath 110 and is full in the outer bath 110. For example, the second gas supply unit 210 is disposed above the processing liquid LQ in the outer bath 110. "Below" means, for example, downward in the vertical direction D (vertically downward).

Specifically, the second gas supply pipe 25 is disposed inside of the outer bath 110 and ejects the second inert gas GA2 downward from the second ejection holes H2. In this case, for example, the second ejection holes H2 face downward in the vertical direction D. That is, the second ejection holes H2 are disposed on the bottom of the second gas supply pipe 25.

In this embodiment, the first lid member 111 covers the upper opening 106a of the processing bath 105 and the second lid member 112. Accordingly, it is possible to more effectively curb dissolving of oxygen in the processing liquid LQ in the processing bath 105 and the processing liquid LQ in the outer bath 110. By providing the second lid member 112, it is possible to prevent the second inert gas GA2 from flowing out of the outer bath 110. As a result, it is possible to more effectively curb dissolving of oxygen in the processing liquid LQ in the outer bath 110.

In this embodiment, the contact section 52 of the first lid member 111 is in contact with the processing liquid LQ in the processing bath 105 while covering the liquid surface of the processing liquid LQ from above the processing liquid LQ. Accordingly, it is possible to prevent the processing liquid LQ in the processing bath 105 from being exposed to oxygen. As a result, it is possible to more effectively curb dissolving of oxygen in the processing liquid LQ in the processing bath 105.

Figure 2:
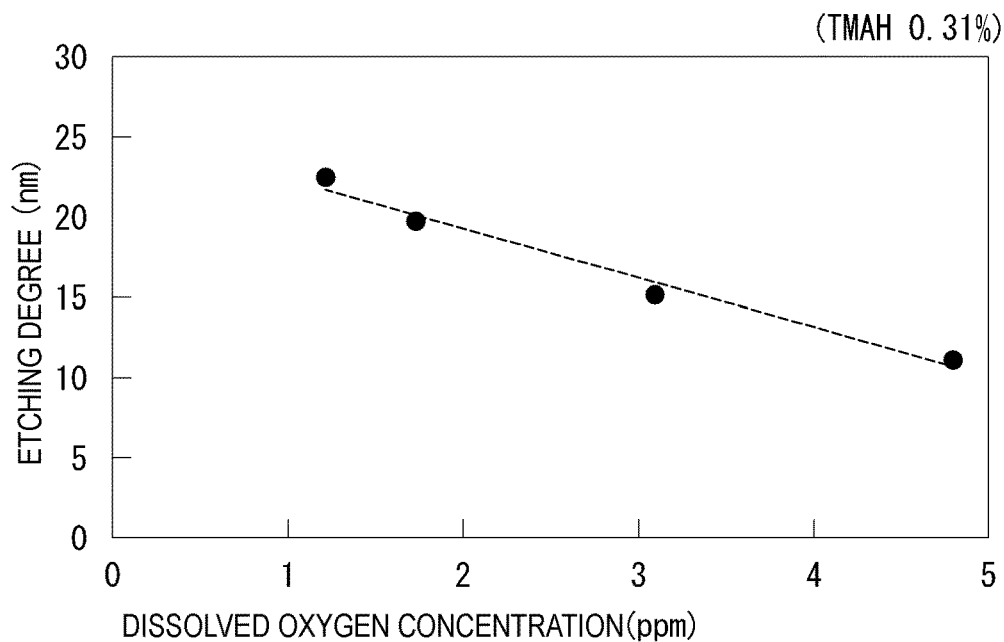
FIG. 2 is a graph illustrating a relationship between a dissolved oxygen concentration in a processing liquid and an etching degree according to the embodiment.

A relationship between a dissolved oxygen concentration and an etching degree will be described below with reference to FIG. 2. FIG. 2 is a graph illustrating a relationship between a dissolved oxygen concentration of the processing liquid LQ and an etching degree. The horizontal axis represents the dissolved oxygen concentration (ppm) in the processing liquid LQ, and the vertical axis represents the etching degree of a substrate W.

FIG. 2 illustrates an example in which TMAH is used as the processing liquid LQ. The concentration of TMAH was 0.31%. The first inert gas GA1 was nitrogen. The second inert gas GA2 was not used. This is for simplifying a test system in this example for the purpose of verifying the relationship between the dissolved oxygen concentration of the processing liquid LQ and the etching degree.

A polysilicon film (a polysilicon layer) was formed on a substrate W. FIG. 2 illustrates an etching degree of the polysilicon film when the substrate W is immersed in TMAH. The etching degree is a value obtained by subtracting a thickness of the polysilicon film after being immersed in TMAH from a thickness of the polysilicon film before being immersed in TMAH. The etching degree may be referred to as an "etching degree of the substrate W."

As illustrated in FIG. 2, as the dissolved oxygen concentration of the processing liquid LQ became less, the etching degree (processing degree) of the substrate W became more.

The etching degree (processing degree) was substantially directly proportional to the dissolved oxygen concentration. A proportional constant was "negative."

Figure 3:
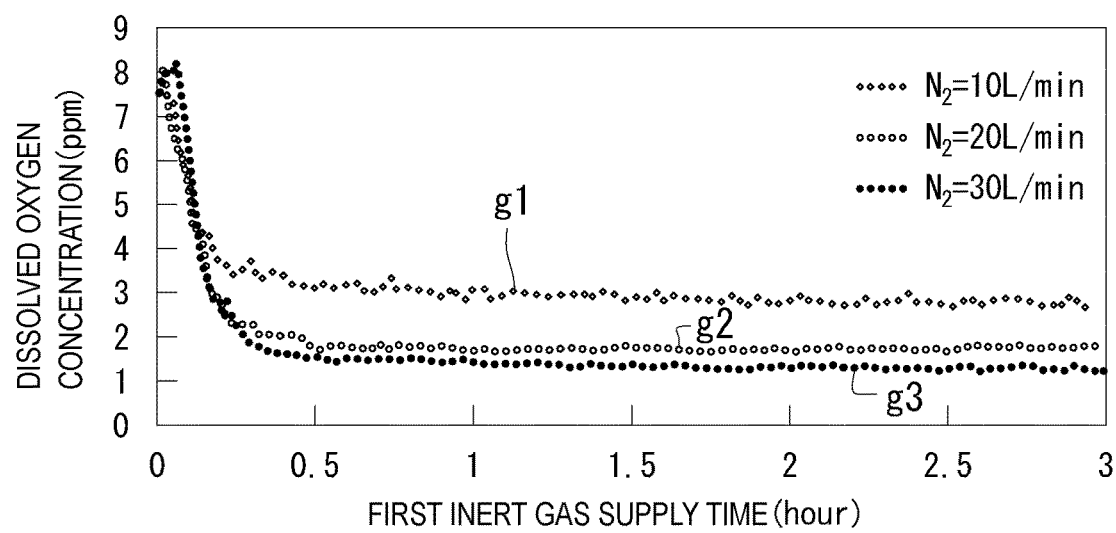
FIG. 3 is a graph illustrating a relationship between a bubble supply time and the dissolved oxygen concentration in the processing liquid according to the embodiment.

A relationship between a flow rate of a first inert gas GA1 and a dissolved oxygen concentration will be described below with reference to FIG. 3. FIG. 3 is a graph illustrating a relationship between a supply time of the first inert gas GA1 (bubbles) and a dissolved oxygen concentration of the processing liquid LQ for each flow rate of the first inert gas GA1. The horizontal axis represents a supply time (hour) of the first inert gas GA1, and the vertical axis represents a dissolved oxygen concentration (ppm) of the processing liquid LQ.

FIG. 3 illustrates an example in which TMAH was used as the processing liquid LQ. The concentration of TMAH was 0.31%. The first inert gas GA1 was nitrogen. The second inert gas GA2 was not used. This is for simplifying a test system in this example for the purpose of verifying the relationship between the flow rate of an inert gas and the dissolved oxygen concentration. In a circulation pipe 141 (FIG. 1), the flow rate of the processing liquid LQ from the pump 142 (FIG. 1) was 23 L/min.

A plot g1 represents the dissolved oxygen concentration when the flow rate of the first inert gas GA1 was 10 liter/min. A plot g2 represents the dissolved oxygen concentration when the flow rate of the first inert gas GA1 was 20 liter/min. A plot g3 represents the dissolved oxygen concentration when the flow rate of the first inert gas GA1 was 30 liter/min. In this case, the flow rate of the first inert gas GA1 indicates a flow rate of the first inert gas GA1 which is supplied to one first gas supply pipe 21.

As can be understood from the plots g1 to g3, the dissolved oxygen concentration of the processing liquid LQ became substantially constant in about one hour. In the state in which the dissolved oxygen concentration became substantially constant, the dissolved oxygen concentration of the processing liquid LQ decreased as the flow rate of the first inert gas GA1 increased. In other words, in the state in which the dissolved oxygen concentration became substantially constant, the dissolved oxygen concentration of the processing liquid LQ decreased as an amount of bubbles BB supplied to the processing liquid LQ increased. This is because the amount of bubbles BB supplied to the processing liquid LQ increases as the flow rate of the first inert gas GA1 increases.

As can be understood from the examples illustrated in FIGS. 2 and 3, since the dissolved oxygen concentration decreased as the flow rate of the first inert gas GA1 increased, the etching degree (processing degree) of the substrate W increased as the flow rate of the first inert gas GA1 increased. That is, since the dissolved oxygen concentration decreased as the amount of bubbles BB supplied to the processing liquid LQ increased, the etching degree (processing degree) of the substrate W increased as the amount of bubbles BB increased.

Figure 4A:
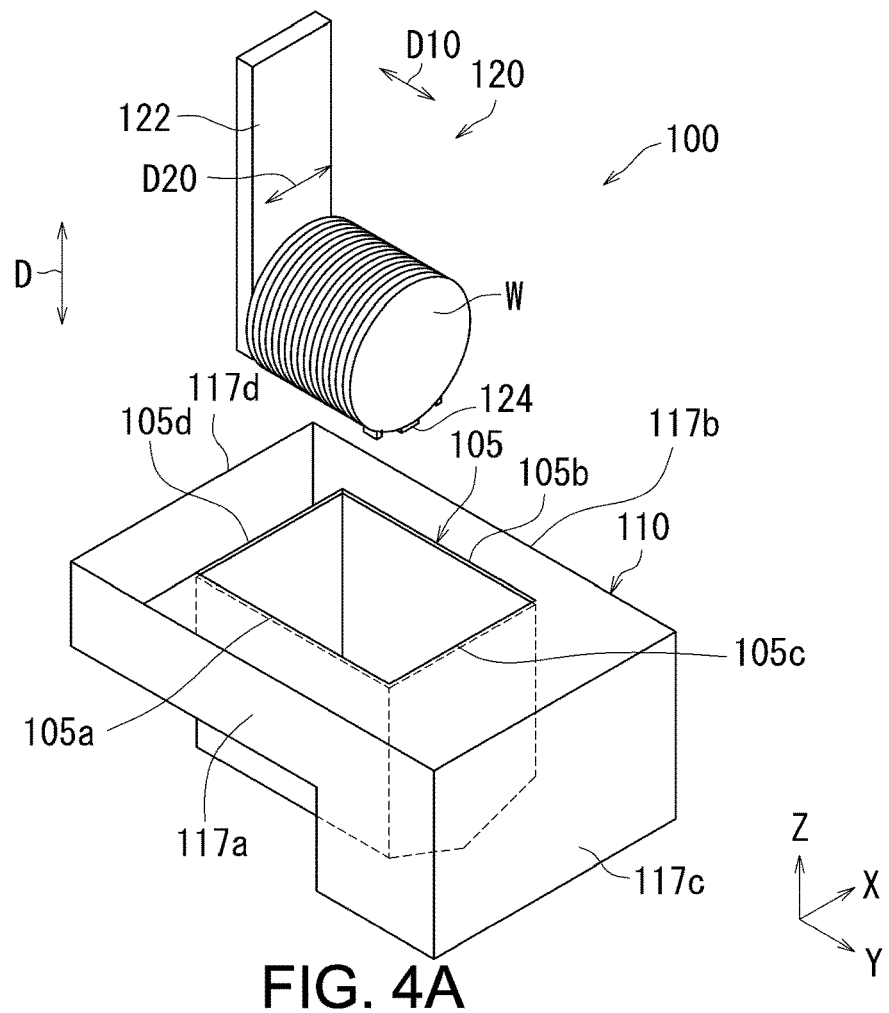
FIG. 4A is a diagram illustrating a state in which a substrate has not yet been immersed in the processing liquid according to the embodiment.
Figure 4B:
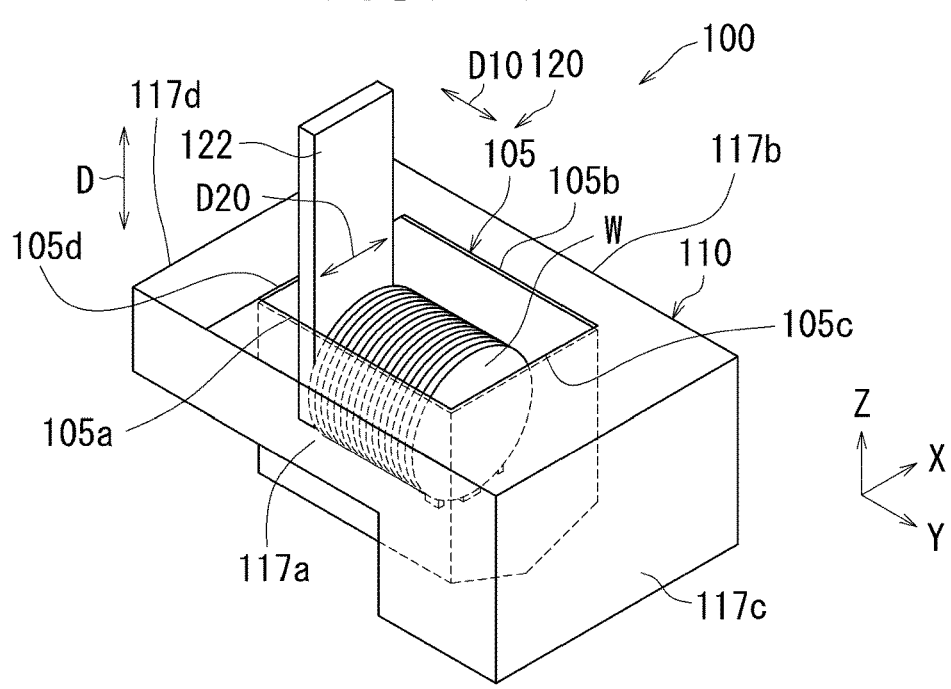
FIG. 4B is a diagram illustrating a state in which a substrate is immersed in the processing liquid according to the embodiment.

The processing bath 105, the outer bath 110, and the substrate holding unit 120 will be described below with reference to FIG. 4A and FIG. 4B. FIG. 4A and FIG. 4B are perspective views schematically illustrating the substrate processing apparatus 100 before and after substrates W have been immersed in the processing bath 105. In FIG. 4A and FIG. 4B, the first lid member 111, the second lid member 112, a processing liquid LQ in the processing bath 105, and a processing liquid LQ in the outer bath 110 in FIG. 1 are not illustrated for the purpose of avoidance of excessive complication of the drawings. In FIG. 4A and FIG. 4B, it is assumed that substrates W of one lot (for example, 25 substrates) are processed in the processing bath 105.

As illustrated in FIG. 4A, the processing bath 105 includes a pair of side walls 105a and 105b, a front wall 105c, and a rear wall 105d.

The pair of side walls 105a and 105b extend in the first direction D10. The pair of side walls 105a and 105b are arranged with a gap in the second direction D20. Each of the pair of side walls 105a and 105b has substantially a panel shape and is substantially parallel to the vertical direction D.

The front wall 105c and the rear wall 105d extend in the second direction D20. The front wall 105c and the rear wall 105d are arranged with a gap therebetween in the first direction D10. Each of the front wall 105c and the rear wall 105d has substantially a panel shape and is substantially parallel to the vertical direction D. The front wall 105c and the rear wall 105d are substantially perpendicular to the pair of side walls 105a and 105b.

The outer bath 110 surrounds the processing bath 105. Specifically, the outer bath 110 surrounds at least a circumferential surface of an upper part of the processing bath 105. More specifically, the outer bath 110 includes a first storage section 117a, a second storage section 117b, a third storage section 117c, and a fourth storage section 117d. The first to fourth storage sections 117a to 117d store a processing liquid LQ overflowing from the processing bath 105.

The first storage section 117a extends along the side wall 105a. The first storage section 117a extends in the first direction D10. The first storage section 117a is disposed outside of an upper part of the side wall 105a.

The second storage section 117b extends along the side wall 105b. The second storage section 117b is disposed outside of an upper part of the side wall 105b. The second storage section 117b extends in the first direction D10.

The third storage section 117c extends along the front wall 105c. The third storage section 117c extends in the second direction D20. The third storage section 117c is disposed outside of the front wall 105c. The third storage section 117c extends from the top to the bottom of the front wall 105c.

The fourth storage section 117d extends along the rear wall 105d. The fourth storage section 117d is disposed outside of an upper part of the rear wall 105d. The fourth storage section 117d extends in the second direction D20.

The substrate holding unit 120 holds a plurality of substrates W in the first direction D10. Specifically, the substrate holding unit 120 holds the plurality of substrates W (the substrates W of one lot) with intervals in the first direction D10. The plurality of substrates W are arranged in a line in the first direction D10. In other words, the first direction D10 indicates a direction in which the plurality of substrates W are arranged. The first direction D10 is substantially parallel to the horizontal direction and is substantially perpendicular to the vertical direction D. The plurality of substrates W are substantially parallel to the second direction D20. The second direction D20 is substantially perpendicular to the first direction D10 and the vertical direction D and is substantially parallel to the horizontal direction.

The first direction D10 corresponds to an example of a "predetermined direction" in the disclosure.

In FIG. 4A, the substrate holding unit 120 is located above the processing bath 105. The substrate holding unit 120 moves down in the vertical direction D with the plurality of substrates W held thereby. Accordingly, the plurality of substrates W are input to the processing bath 105. When the substrate holding unit 120 moves down to the processing bath 105 as illustrated in FIG. 4B, the plurality of substrates W are immersed in the processing liquid LQ in the processing bath 105.

Figure 5:
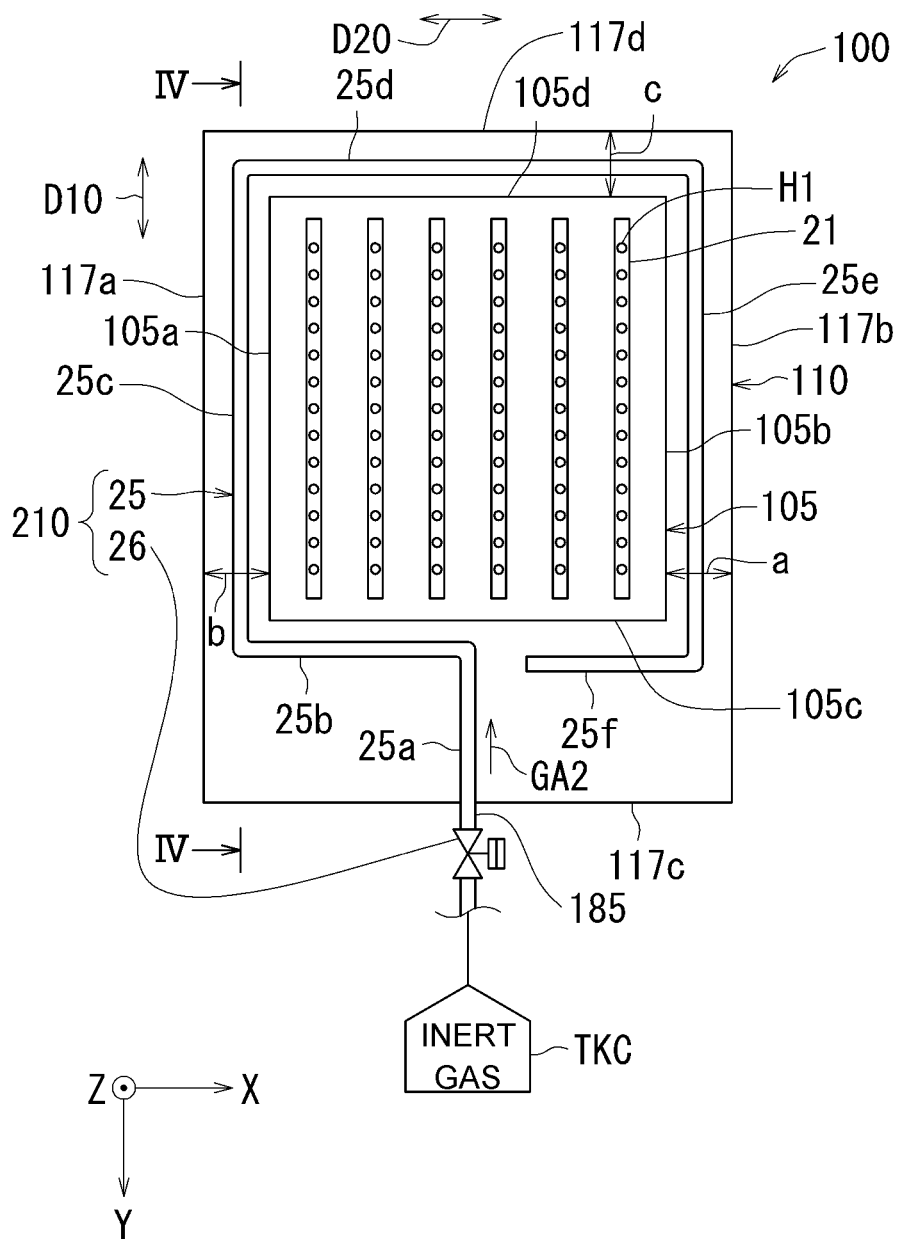
FIG. 5 is a top planar view schematically illustrating the substrate processing apparatus in a state in which a first lid member and a second lid member are detached according to the embodiment.

The second gas supply unit 210 (FIG. 1) will be described below with reference to FIGS. 5 and 6. FIG. 5 is a planar view schematically illustrating the substrate processing apparatus 100 when the first lid member 111 and the second lid member 112 (FIG. 1) are detached. In FIG. 5, no substrates W are input to the processing bath 105.

As illustrated in FIG. 5, the second gas supply unit 210 includes a second gas supply pipe 25 and a valve 26. The second gas supply pipe 25 is disposed inside of the outer bath 110. The second gas supply pipe 25 surrounds the processing bath 105. Specifically, the second gas supply pipe 25 includes a first pipe portion 25a, a second pipe portion 25b, a third pipe portion 25c, a fourth pipe portion 25d, a fifth pipe portion 25e, and a sixth pipe portion 25f.

The first pipe portion 25a is disposed inside of the third storage section 117c. Specifically, the first pipe portion 25a is disposed in an upper area in the third storage section 117c. The first pipe portion 25a extends in the first direction D10. The first pipe portion 25a extends from inside to outside of the outer bath 110.

The second pipe portion 25b is disposed inside of the third storage section 117c. Specifically, the second pipe portion 25b is disposed in an upper area in the third storage section 117c. The second pipe portion 25b is bent from a downstream end of the first pipe portion 25a and extends along the front wall 105c. The second pipe portion 25b extends in the second direction D20.

The third pipe portion 25c is disposed inside of the first storage section 117a. Specifically, the third pipe portion 25c is disposed in an upper area in the first storage section 117a. The third pipe portion 25c is bent from a downstream end of the second pipe portion 25b and extends along the side wall 105a. The third pipe portion 25c extends in the first direction D10.

The fourth pipe portion 25d is disposed inside of the fourth storage section 117d. Specifically, the fourth pipe portion 25d is disposed in an upper area in the fourth storage section 117d. The fourth pipe portion 25d is bent from a downstream end of the third pipe portion 25c and extends along the rear wall 105d. The fourth pipe portion 25d extends in the second direction D20.

The fifth pipe portion 25e is disposed inside of the second storage section 117b. Specifically, the fifth pipe portion 25e is disposed in an upper area in the second storage section 117b. The fifth pipe portion 25e is bent from a downstream end of the fourth pipe portion 25d and extends along the side wall 105b. The fifth pipe portion 25e extends in the first direction D10.

The sixth pipe portion 25f is disposed inside of the third storage section 117c. Specifically, the sixth pipe portion 25f is disposed in an upper area in the third storage section 117c. The sixth pipe portion 25f is bent from a downstream end of the fifth pipe portion 25e and extends along the front wall 105c. The sixth pipe portion 25f extends in the second direction D20. A downstream end of the sixth pipe portion 25f is closed.

A plurality of second ejection holes H2 (FIG. 1) are provided in each of the first to sixth pipe portions 25a to 25f. Accordingly, it is possible to curb dissolving of oxygen in the processing liquid LQ in any of the first to fourth storage sections 117a to 117d.

The substrate processing apparatus 100 further includes a pipe 185. The pipe 185 connects the second gas supply pipe 25 (specifically, the first pipe portion 25a) and an inert gas source TKC via the valve 26. The inert gas source TKC stores an inert gas. The inert gas includes a first inert gas GA1 and a second inert gas GA2. This is because the first inert gas GA1 and the second inert gas GA2 are the same inert gas in this embodiment.

The inert gas source TKC supplies the second inert gas GA2 to the second gas supply pipe 25 via the valve 26 and the pipe 185.

Specifically, the valve 26 is disposed in the pipe 185 outside of the processing bath 105 and the outer bath 110. The valve 26 supplies the second inert gas GA2 from the inert gas source TKC to the second gas supply pipe 25 by opening a flow channel of the pipe 185. On the other hand, the valve 26 stops supply of the second inert gas GA2 from the inert gas source TKC to the second gas supply pipe 25 by closing the flow channel of the pipe 185.

Figure 6:
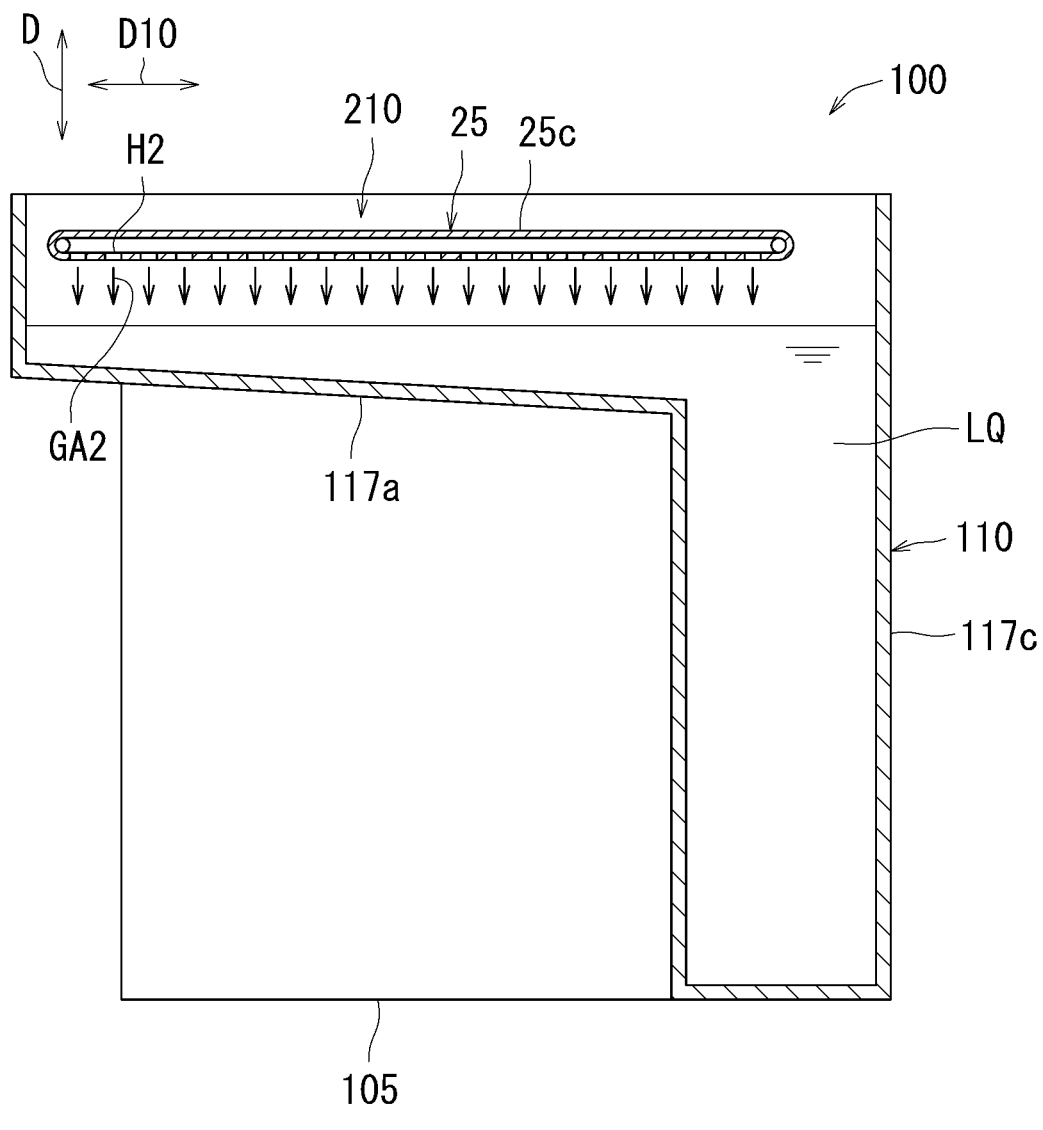
FIG. 6 is a sectional view along line VI-VI in FIG. 5.

FIG. 6 is a sectional view taken along line VI-VI in FIG. 5. As illustrated in FIG. 6, the second gas supply pipe 25 is disposed above the processing liquid LQ in the outer bath 110. In the second gas supply pipe 25, the plurality of second ejection holes H2 are arranged substantially linearly with intervals in the first direction D10. The plurality of second ejection holes H2 are open downward in the vertical direction D and faces the liquid surface of the processing liquid LQ in the vertical direction D. The second gas supply pipe 25 ejects the second inert gas GA2 from the plurality of second ejection holes H2 to the liquid surface of the processing liquid LQ in the outer bath 110.

Figure 7:
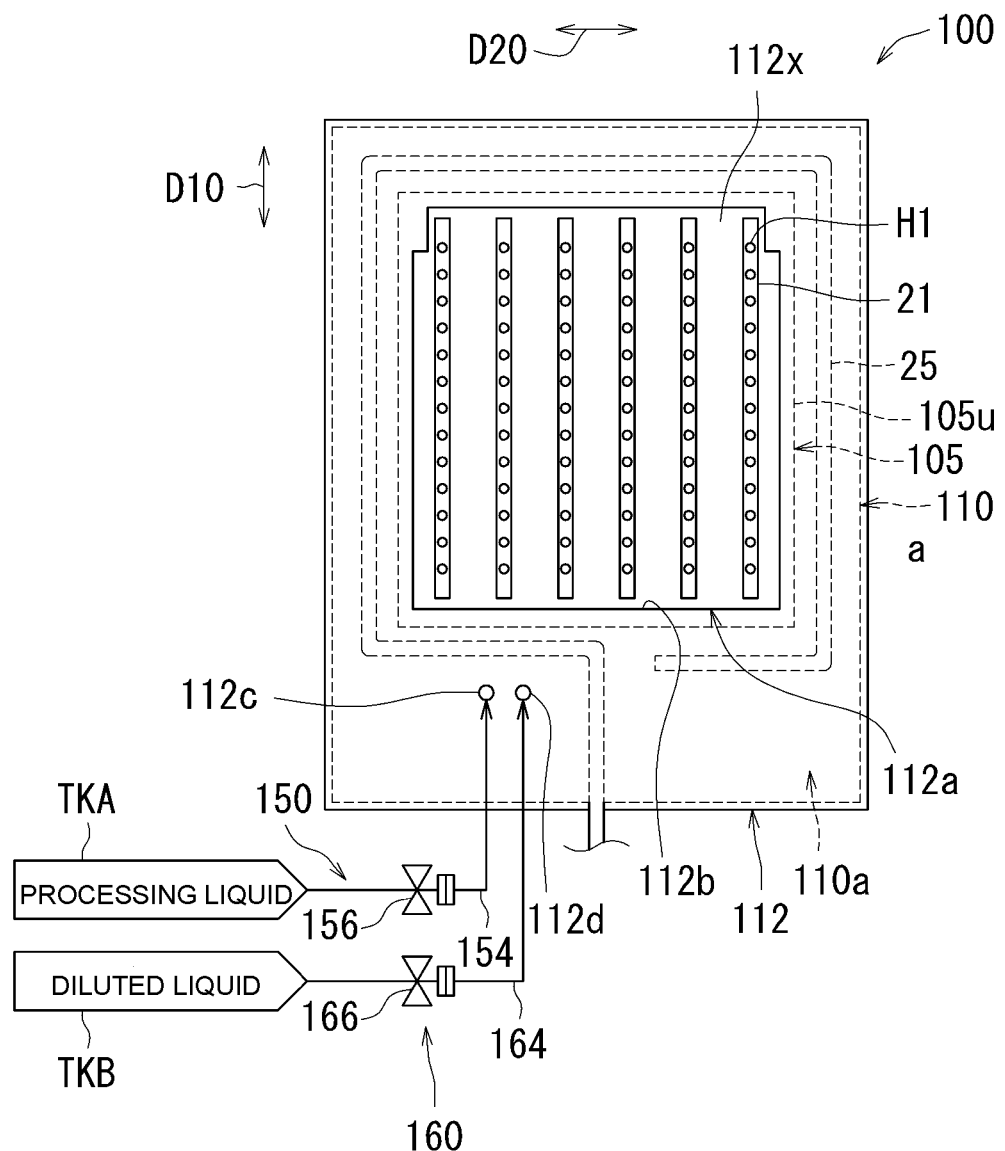
FIG. 7 is a top planar view schematically illustrating the substrate processing apparatus when the first lid member is detached according to the embodiment.

The second lid member 112 will be described below with reference to FIG. 7. FIG. 7 is a planar view schematically illustrating the substrate processing apparatus 100 when the first lid member 111 (FIG. 1) is detached. In FIG. 7, no substrates W are not input to the processing bath 105.

As illustrated in FIG. 7, the second lid member 112 covers an upper opening 110a of the outer bath 110. The second lid member 112 includes an opening 112a. The opening 112a has substantially a rectangular shape. An edge 112b of the opening 112a extends along an upper edge 105u of the processing bath 105 inside of the upper edge 105u of the processing bath 105.

The second lid member 112 includes a processing liquid hole 112c and a diluted liquid hole 112d. The substrate processing apparatus 100 further includes a processing liquid supply unit 150 and a diluted liquid supply unit 160.

The processing liquid supply unit 150 supplies the processing liquid LQ to the outer bath 110 via the processing liquid hole 112c under the control of the control unit 221 (FIG. 1). The processing liquid supply unit 150 supplies the processing liquid LQ to the outer bath 110, for example, after the processing bath 105 and the outer bath 110 have been washed or when the processing liquid LQ is replaced.

Specifically, the processing liquid supply unit 150 includes a pipe 154 and a valve 156. The processing liquid LQ is supplied to the pipe 154 from a processing liquid source TKA. The valve 156 is disposed in the pipe 154. When the valve 156 opens, the processing liquid LQ is supplied into the outer bath 110 from the pipe 154 via the processing liquid hole 112c. Then, the processing liquid LQ is supplied to the processing bath 105 from the outer bath 110 by the processing liquid introduction unit 125 (FIG. 1). The processing liquid LQ may be supplied directly to the processing bath 105.

The diluted liquid supply unit 160 supplies a diluted liquid to the outer bath 110 under the control of the control unit 221 (FIG. 1). Specifically, the diluted liquid supply unit 160 includes a pipe 164 and a valve 166. The diluted liquid is supplied to the pipe 164 from a dilute liquid source TKB.

The valve 166 is disposed in the pipe 164. When the valve 166 opens, the diluted liquid is supplied into the outer bath 110 from the pipe 164 via the diluted liquid hole 112d.

Figure 8:
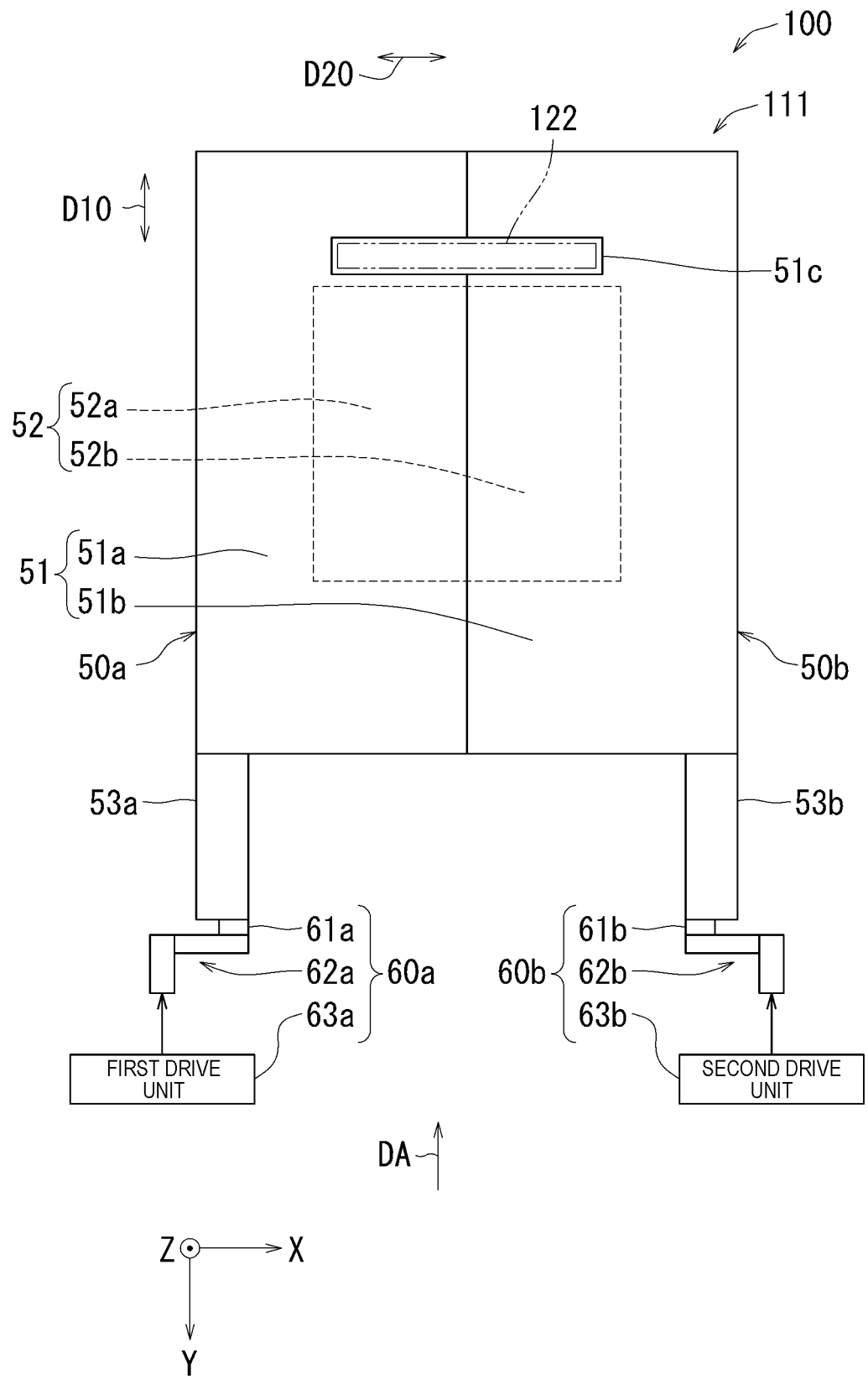
FIG. 8 is a top planar view schematically illustrating the first lid member according to the embodiment.

The first lid member 111 will be described below with reference to FIG. 8 and FIG. 9A and FIG. 9B. FIG. 8 is a planar view schematically illustrating the first lid member 111. As illustrated in FIG. 8, the separated section 51 of the first lid member 111 includes an opening 51c. The opening 51c has substantially a rectangular shape. The opening 51c extends in the second direction D20. The opening 51c overlaps a part 112x (FIG. 7) of the opening 112a of the second lid member 112 in the vertical direction D. A body plate 122 of the substrate holding unit 120 (FIG. 4A and FIG. 4B) is inserted into the opening 51c.

The separated section 51 of the first lid member 111 includes a first separated section 51a and a second separated section 51b. Each of the first separated section 51a and the second separated section 51b has substantially a panel shape. The contact section 52 includes a first contact section 52a and a second contact section 52b. Each of the first contact section 52a and the second contact section 52b has substantially a panel shape.

The first separated section 51a and the first contact section 52a constitute a first hinged door unit 50a. The first separated section 51a and the first contact section 52a may be formed as a unified body or may be formed as separate members. When the first separated section 51a and the first contact section 52a are separate members, the first separated section 51a and the first contact section 52a are connected.

The second separated section 51b and the second contact section 52b constitute a second hinged door unit 50b. The second separated section 51b and the second contact section 52b may be formed as a unified body or may be formed as separate members. When the second separated section 51b and the second contact section 52b are separate members, the second separated section 51b and the second contact section 52b are connected.

The first lid member 111 further includes a first support portion 53a and a second support portion 53b. The substrate processing apparatus 100 further includes a first drive mechanism 60a and a second drive mechanism 60b. The first drive mechanism 60a includes a first rotation shaft 61a, a first connection portion 62a, and a first drive unit 63a. The second drive mechanism 60b includes a second rotation shaft 61b, a second connection portion 62b, and a second drive unit 63b.

The first support portion 53a supports the first hinged door unit 50a. The first drive mechanism 60a is connected to the first support portion 53a. The first drive mechanism 60a opens or closes the first hinged door unit 50a with respect to the upper opening 106a of the processing bath 105 (FIG. 1) by rotationally driving the first hinged door unit 50a via the first support portion 53a.

Specifically, the first support portion 53a is connected to one end in the first direction D10 of the first separated section 51a on one side in the second direction D20 of the first lid member 111. The first support portion 53a extends in the first direction D10. The first rotation shaft 61a is connected to the first support portion 53a. The first rotation shaft 61a extends in the first direction D10. The first connection portion 62a is a connection mechanism and connects the first rotation shaft 61a and the first drive unit 63a. The first drive unit 63a causes the first rotation shaft 61a to rotate via the first connection portion 62a. As a result, the first support portion 53a rotates and the first hinged door unit 50a supported by the first support portion 53a rotates. In this way, the first drive unit 63a rotationally drives the first hinged door unit 50a around the first rotation shaft 61a. The first drive unit 63a includes, for example, a motor or an air cylinder.

The second support portion 53b supports the second hinged door unit 50b. The second drive mechanism 60b is connected to the second support portion 53b. The second drive mechanism 60b opens or closes the second hinged door unit 50b with respect to the upper opening 106a of the processing bath 105 (FIG. 1) by rotationally driving the second hinged door unit 50b via the second support portion 53b.

Specifically, the second support portion 53b is connected to one end in the first direction D10 of the second separated section 51b on other side in the second direction D20 of the first lid member 111. The second support portion 53b extends in the first direction D10. The second rotation shaft 61b is connected to the second support portion 53b. The second rotation shaft 61b extends in the first direction D10. The second connection portion 62b is a connection mechanism and connects the second rotation shaft 61b and the second drive unit 63b. The second drive unit 63b causes the second rotation shaft 61b to rotate via the second connection portion 62b. As a result, the second support portion 53b rotates and the second hinged door unit 50b supported by the second support portion 53b rotates. In this way, the second drive unit 63b rotationally drives the second hinged door unit 50b around the second rotation shaft 61b. The second drive unit 63b includes, for example, a motor or an air cylinder.

Figure 9A:
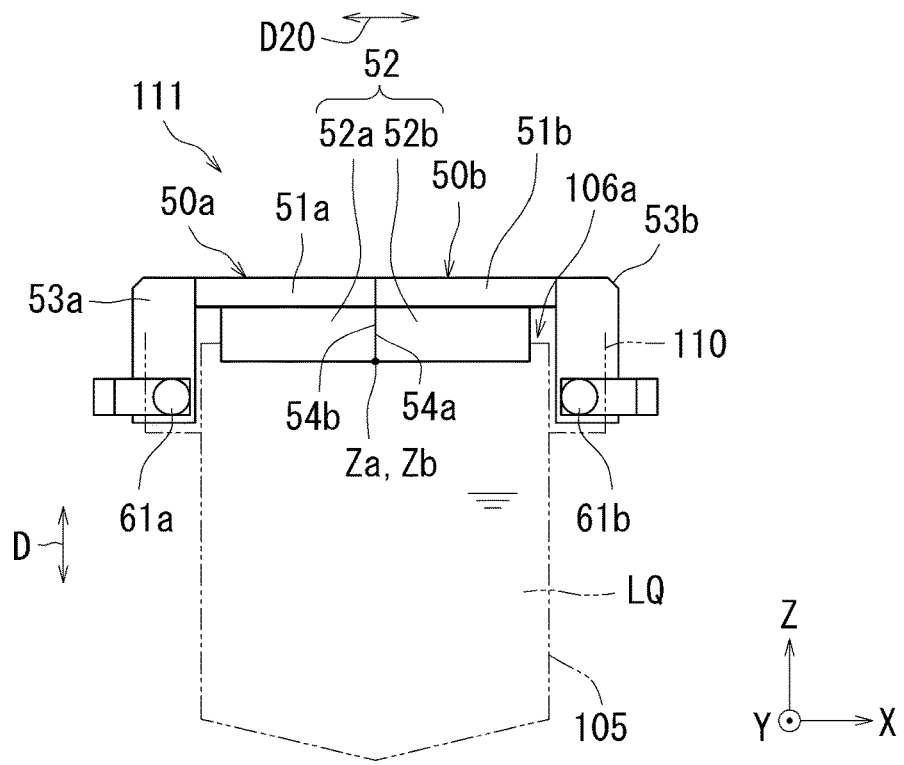
FIG. 9A is a view schematically illustrating a state in which the first lid member is closed according to the embodiment.

FIG. 9A is a diagram schematically illustrating a state in which the first lid member 111 is closed. FIG. 9B is a diagram schematically illustrating a state in which the first lid member 111 is open. In FIG. 9A and FIG. 9B, the first lid member 111 is seen in the direction DA in FIG. 8.

When the first hinged door unit 50a and the second hinged door unit 50b are closed as illustrated in FIG. 9A, the first lid member 111 is closed.

In the state in which the first lid member 111 is closed, the first hinged door unit 50a covers one side in the second direction D20 of the upper opening 106a of the processing bath 105. Accordingly, the first contact section 52a comes into contact with one side in the second direction D20 of the liquid surface of the processing liquid LQ. In the example illustrated in FIG. 9A, the lower part of the first contact section 52a is immersed into one side in the second direction D20 of the liquid surface of the processing liquid LQ.

In the state in which the first lid member 111 is closed, the second hinged door unit 50b covers the other side in the second direction D20 of the upper opening 106a of the processing bath 105. Accordingly, the second contact section 52b comes into contact with the other side in the second direction D20 of the liquid surface of the processing liquid LQ. In the example illustrated in FIG. 9A, the lower part of the second contact section 52b is immersed into the other side in the second direction D20 of the liquid surface of the processing liquid LQ.

In a state in which the first hinged door unit 50a and the second hinged door unit 50b are closed, an end face 54a of the first hinged door unit 50a and an end face 54b of the second hinged door unit 50b come into contact. In the state in which the first hinged door unit 50a and the second hinged door unit 50b are closed, the first rotation shaft 61a and the second rotation shaft 61b are located below a portion Za of the first hinged door unit 50a and a portion Zb of the second hinged door unit 50b. As a result, since interference of the first hinged door unit 50a and the second hinged door unit 50b with each other is prevented, it is possible to smoothly open and close the first hinged door unit 50a and the second hinged door unit 50b.

The portion Za is a lower end of the first contact section 52a at the center in the second direction D20 of the contact section 52 in the state in which the first hinged door unit 50a and the second hinged door unit 50b are closed. The portion Zb is a lower end of the second contact section 52b at the center in the second direction D20 of the contact section 52 in the state in which the first hinged door unit 50a and the second hinged door unit 50b are closed.

Figure 9B:
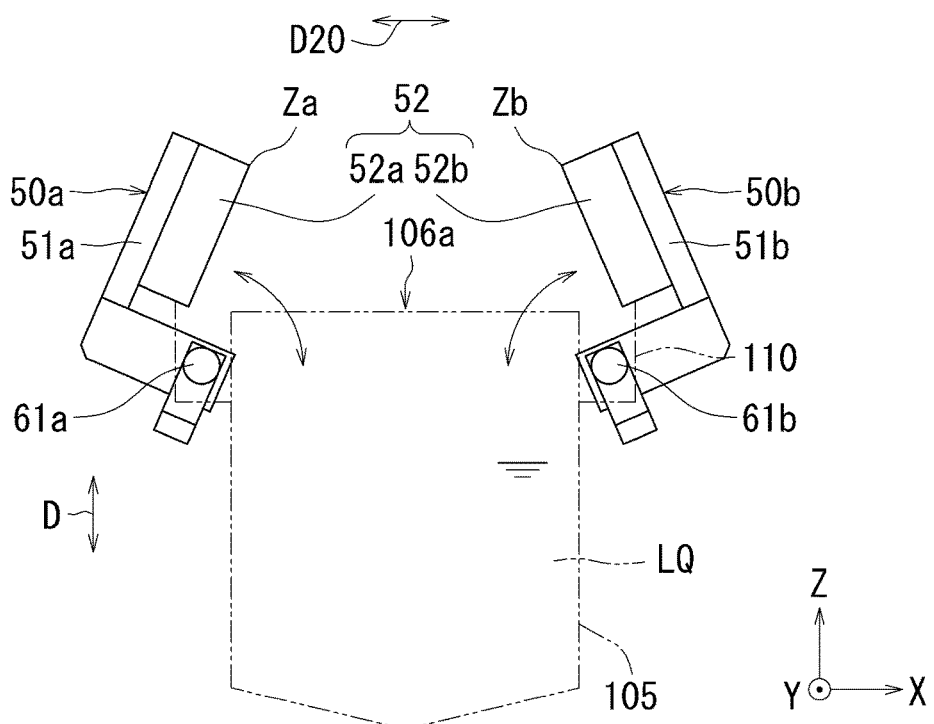
FIG. 9B is a view schematically illustrating a state in which the first lid member is open according to the embodiment.

When the first rotation shaft 61a rotates in the counter-clockwise direction as illustrated in FIG. 9B, the first hinged door unit 50a opens one side in the second direction D20 of the upper opening 106a of the processing bath 105. On the other hand, when the first rotation shaft 61a rotates in the clockwise direction, the first hinged door unit 50a covers one side in the second direction D20 of the upper opening 106a of the processing bath 105.

When the second rotation shaft 61b rotates in the clockwise direction, the second hinged door unit 50b opens the other side in the second direction D20 of the upper opening 106a of the processing bath 105. On the other hand, when the second rotation shaft 61b rotates in the counterclockwise direction, the second hinged door unit 50b covers the other side in the second direction D20 of the upper opening 106a of the processing bath 105.

Details of another configuration of the substrate processing apparatus 100 will be described below with reference back to FIG. 1. The substrate holding unit 120 moves up or down in the vertical direction D in the state in which a plurality substrates W are held thereby. Specifically, the substrate holding unit 120 includes a body plate 122 and a plurality of holding rods 124. The body plate 122 is a plate extending in the vertical direction D. The plurality of holding rods 124 extend in the first direction D10 (FIG. 4A and FIG. 4B) from the body plate 122. The plurality of substrates W are held in an upright posture (a vertical posture) in a state in which a lower edge of each of the substrates W is in contact with the plurality of holding rods 124 and the substrates are arranged with intervals.

The substrate holding unit 120 may further include a lifting unit 126. The lifting unit 126 lifts the body plate 122 between a processing position (the position illustrated in FIG. 4B) at which the plurality of substrates W held by the substrate holding unit 120 are located in the processing bath 105 and a standby position (the position illustrated in FIG. 4A) at which the plurality of substrates W held by the substrate holding unit 120 are located above the processing bath 105. Accordingly, when the body plate 122 is moved to the processing position by the lifting unit 126, the plurality of substrates W held by the holding rods 124 are immersed in the processing liquid LQ. In this state, the plurality of substrates W are processed.

The processing liquid introduction unit 125 includes an introduction unit 130 and a circulation unit 140.

The introduction unit 130 introduces the processing liquid LQ into the processing bath 105. The introduction unit 130 is disposed below the first gas supply unit 200 (specifically, the first gas supply pipe 21) in the processing bath 105.

Specifically, the introduction unit 130 includes a plate 31. The plate 31 has substantially a panel shape. The plate 31 partitions the inside of the processing bath 105 to form a processing chamber 113 and an introduction chamber 115. That is, the processing bath 105 includes the processing chamber 113 and the introduction chamber 115. The processing chamber 113 is a chamber above the plate 31 inside of the processing bath 105. The first gas supply unit 200 is disposed in the processing chamber 113. The substrates W are disposed in the processing chamber 113. The introduction chamber 115 is a chamber below the plate 31 inside of the processing bath 105.

The plate 31 is disposed below the first gas supply unit 200. The plate 31 covers the bottom surface of the processing bath 105. The plate 31 is substantially perpendicular to the vertical direction D. The plate 31 includes a plurality of processing liquid holes P. The processing liquid holes P penetrate the plate 31. The processing liquid holes P are disposed in the whole surface of the plate 31. The processing liquid holes P face upward in the vertical direction D.

The plurality of first gas supply pipes 21 are disposed above the plate 31 and below the substrates W inside of the processing bath 105.

The introduction unit 130 introduces the processing liquid LQ into the processing bath 105 upward from the plurality of processing liquid holes P in a state in which the processing liquid LQ is stored in the processing bath 105. Accordingly, the introduction unit 130 can generate a streamline flow of the processing liquid LQ supplied from the circulation unit 140. That is, the introduction unit 130 introduces the processing liquid LQ into the processing bath 105 by generating a streamline flow of the processing liquid LQ. The streamline flow of the processing liquid LQ flows substantially upward in the vertical direction D from the plurality of processing liquid holes P.

According to this embodiment, since the processing liquid LQ is introduced into the processing bath 105 using the streamline flow of the processing liquid LQ, it is possible to curb disturbance of a flow of bubbles BB supplied to the processing liquid LQ by the first gas supply unit 200. Accordingly, it is possible to effectively decrease the dissolved oxygen concentration of the processing liquid LQ using the bubbles BB. As a result, it is possible to effectively process (for example, etch) the substrates W using the processing liquid LQ.

Specifically, the introduction unit 130 includes at least one ejector 131 and at least one distribution plate 132. The ejector 131 is, for example, a nozzle or a pipe. The distribution plate 132 has, for example, substantially a panel shape. The distribution plate 132 is substantially perpendicular to the vertical direction D. The ejector 131 and the distribution plate 132 are disposed in the introduction chamber 115.

The ejector 131 is located below the distribution plate 132. The ejector 131 faces the distribution plate 132 in the vertical direction D. The ejector 131 ejects the processing liquid LQ supplied from the circulation unit 140 to the distribution plate 132. Accordingly, the processing liquid LQ collides with the distribution plate 132. As a result, a pressure of the processing liquid LQ is distributed by the distribution plate 132. That is, the distribution plate 132 distributes the pressure of the processing liquid LQ ejected by the ejector 131. The processing liquid LQ of which the pressure has been distributed by the distribution plate 132 spreads substantially in the horizontal direction in the introduction chamber 115. The processing liquid LQ is supplied as a streamline flow to the processing chamber 113 upward in the vertical direction D from the processing liquid holes P of the plate 31. In this respect of generating a streamline flow of the processing liquid LQ in the vertical direction D, the introduction unit 130 has a function of rectifying the processing liquid LQ.

The circulation unit 140 circulates the processing liquid LQ in the processing bath 105 by supplying the processing liquid LQ overflowing from the processing bath 105 and flowing into the outer bath 110 to the introduction unit 130.

Specifically, the circulation unit 140 includes a circulation pipe 141, a pump 142, a heater 143, a filter 144, a control valve 145, and a valve 146. The pump 142, the heater 143, the filter 144, the control valve 145, and the valve 146 are arranged in this order from upstream to downstream of the circulation pipe 141.

The circulation pipe 141 connects the outer bath 110 and the processing bath 105. The circulation pipe 141 returns the processing liquid LQ overflowing from the processing bath 105 and flowing into the outer bath 110 to the processing bath 105. In this way, the processing liquid LQ flows in the circulation pipe 141. Specifically, an upstream end of the circulation pipe 141 is connected to the outer bath 110. On the other hand, a downstream end of the circulation pipe 141 is connected to the introduction unit 130 (specifically, the ejector 131). Accordingly, the circulation pipe 141 guides the processing liquid LQ from the outer bath 110 to the introduction unit 130 (specifically, the ejector 131).

The pump 142 pumps out the processing liquid LQ from the outer bath 110 to the processing bath 105 via the circulation pipe 141. Specifically, the pump 142 pumps out the processing liquid LQ in the outer bath 110 from the circulation pipe 141 to the ejector 131. Accordingly, the ejector 131 ejects the processing liquid LQ supplied from the circulation pipe 141. The filter 144 filtrates the processing liquid LQ flowing the circulation pipe 141. As the flow rate of the processing liquid LQ increases, the filtering effect of the filter 144 increases.

The heater 143 heats the processing liquid LQ flowing in the circulation pipe 141. That is, the heater 143 adjusts the temperature of the processing liquid LQ. The control valve 145 controls the flow rate of the processing liquid LQ supplied to the ejector 131 by adjusting an opening level of the circulation pipe 141. Specifically, the control valve 145 minutely adjusts the flow rate of the processing liquid LQ flowing in the circulation pipe 141. This is basically because the flow rate of the processing liquid LQ flowing in the circulation pipe 141 is set by the pump 142. The valve 146 opens and closes the circulation pipe 141.

The liquid discharge unit 170 includes a liquid discharge pipe 170a and a valve 170b. The liquid discharge pipe 170a is connected to the bottom of the processing bath 105. The valve 170b is disposed in the liquid discharge pipe 170a. When the valve 170b opens, the processing liquid LQ stored in the processing bath 105 is discharged to the outside via the liquid discharge pipe 170a. The discharged processing liquid LQ is sent to a discharged liquid processing device (not illustrated) and is processed thereby.

The gas flow rate adjusting unit 180 supplies the first inert gas GA1 supplied from the inert gas source TKC to the plurality of first gas supply pipes 21. Specifically, the substrate processing apparatus 100 further includes a plurality of pipes 181. The plurality of pipes 181 are connected to the plurality of first gas supply pipes 21. The gas flow rate adjusting unit 180 supplies the first inert gas GA1 supplied from the inert gas source TKC to the plurality of first gas supply pipes 21 from the plurality of pipes 181.

Specifically, the gas flow rate adjusting unit 180 includes a plurality of gas flow rate adjusting mechanisms 182. The plurality of gas flow rate adjusting mechanisms 182 are connected to the plurality of pipes 181. That is, one end of each pipe 181 is connected to the corresponding first gas supply pipe 21, and the other end of the pipe 181 is connected to the corresponding gas flow rate adjusting mechanism 182. The plurality of gas flow rate adjusting mechanisms 182 are provided to correspond to the plurality of first gas supply pipes 21. Each of the gas flow rate adjusting mechanisms 182 supplies the first inert gas GA1 supplied from the inert gas source TKC to the corresponding first gas supply pipe 21 via the corresponding pipe 181. Each of the gas flow rate adjusting mechanisms 182 adjusts the flow rate of the first inert gas GA1 supplied to the corresponding first gas supply pipe 21.

Figure 10:
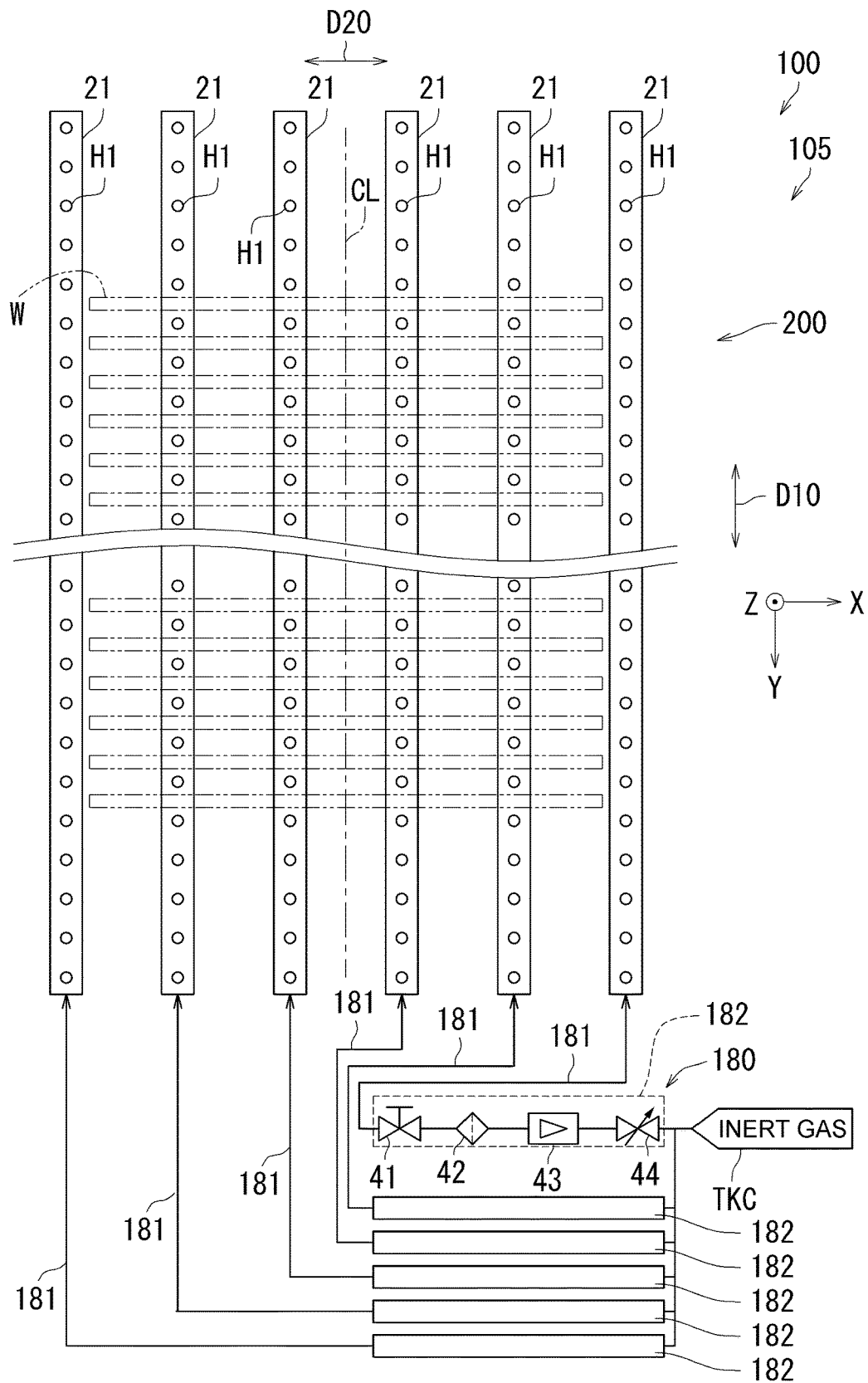
FIG. 10 is a top planar view schematically illustrating a first gas supply unit according to the embodiment.

The first gas supply unit 200 will be described below with reference to FIG. 10. FIG. 10 is a planar view schematically illustrating the first gas supply unit 200. As illustrated in FIG. 10, a plurality of first gas supply pipes 21 are arranged parallel to each other with intervals therebetween in a planar view. In the example illustrated in FIG. 10, the plurality of first gas supply pipes 21 are arranged symmetric with respect to a virtual center line CL. The virtual centerline CL passes through the center of the substrates W and extends in the first direction D10.

Specifically, the plurality of first gas supply pipes 21 are arranged parallel to each other with intervals in the second direction D20 in the processing bath 105. Each of the first gas supply pipe 21 extends in the first direction D10. In each of the plurality of first gas supply pipes 21, the plurality of first ejection holes H1 are arranged substantially linearly with intervals in the first direction D10. In each of the plurality of first gas supply pipes 21, the first ejection holes H1 are provided in the upper part of the first gas supply pipe 21.

Each of the plurality of gas flow rate adjusting mechanisms 182 includes a valve 41, a filter 42, a flowmeter 43, and a control valve 44. The valve 41, the filter 42, the flowmeter 43, and the control valve 44 are arranged in the pipe 181 in this order from downstream to upstream of the pipe 181.

The control valve 44 adjusts the flow rate of the first inert gas GA1 supplied to the pipe 181 to control the flow rate of the first inert gas GA1 supplied to the first gas supply pipe 21 by adjusting an opening level of the pipe 181. The flowmeter 43 measures the flow rate of the first inert gas GA1 flowing in the pipe 181. The control valve 44 adjusts the flow rate of the first inert gas GA1 on the basis of the measurement result from the flowmeter 43. For example, a mass flow controller may be provided instead of the control valve 44 and the flowmeter 43.

The filter 42 removes foreign matter from the first inert gas GA1 flowing in the pipe 181. The valve 41 opens and closes the pipe 181. That is, the valve 41 switches the first inert gas GA1 from the pipe 181 to the first gas supply pipe 21 between supply and supply stop.

Figure 11:
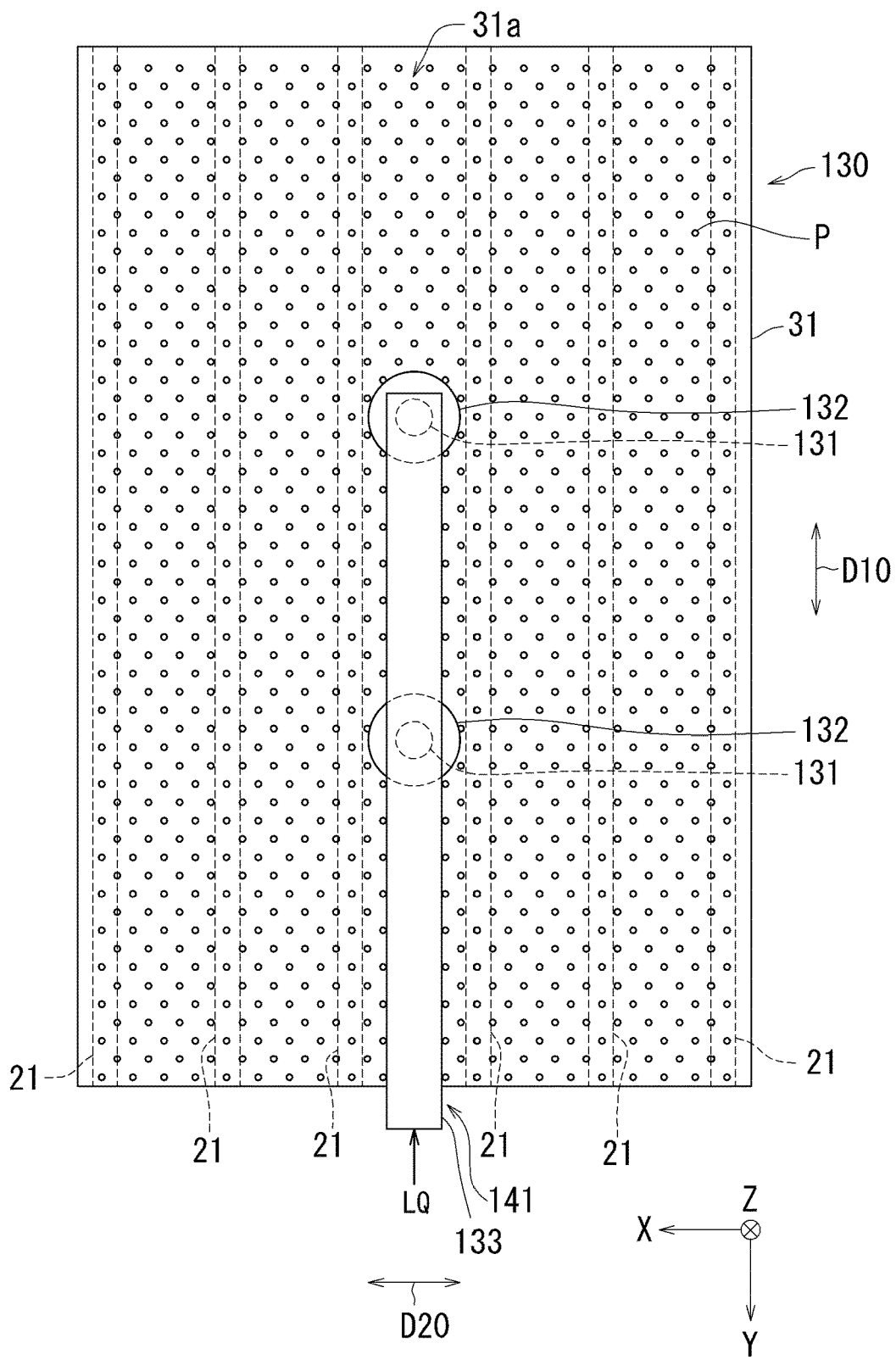
FIG. 11 is a bottom planar view schematically illustrating an introduction unit according to the embodiment.

The introduction unit 130 will be described below with reference to FIG. 11. FIG. 11 is a rear planar view schematically illustrating the introduction unit 130. As illustrated in FIG. 11, the introduction unit 130 includes a plurality of ejectors 131 and a plurality of distribution plates 132. In the example illustrated in FIG. 11, the introduction unit 130 includes two ejectors 131 and two distribution plates 132. The plurality of ejectors 131 are arranged with a gap in the first direction D10. The plurality of distribution plates 132 are arranged with a gap in the first direction D10. The plurality of distribution plates 132 correspond to the plurality of ejectors 131. The plurality of distribution plates 132 are disposed below the plate 31. In the example illustrated in FIG. 11, each distribution plate 132 has substantially a disc shape. The plurality of ejectors 131 are disposed below the plurality of distribution plates 132.

The ejectors 131 and the distribution plates 132 are disposed to correspond to a central area 31a of the plate 31 in the second direction D20 in a rear planar view. The central area 31a extends in the first direction D10.

The circulation pipe 141 (FIG. 1) includes a pipe 133. The pipe 133 extends from one end to the other end in the first direction D10 of the plate 31. The pipe 133 extends in the first direction D10. The pipe 133 faces the rear surface of the plate 31. That is, the pipe 133 is disposed below the plate 31. Specifically, the pipe 133 is disposed below the distribution plates 132.

The ejectors 131 are connected to the top surface of the pipe 133. The ejectors 131 and the pipe 133 communicate with each other. The ejectors 131 protrude vertically upward from the pipe 133 to the distribution plates 132. The processing liquid LQ is supplied to the pipe 133 by the circulation unit 140 (FIG. 1). As a result, the ejectors 131 eject the processing liquid LQ to the distribution plates 132. Accordingly, the pressure of the processing liquid LQ is distributed and the processing liquid LQ spreads in the horizontal direction. Then, the processing liquid LQ moves up from the plurality of processing liquid holes P to form a streamline flow.

A relationship between the dissolved oxygen concentration of the processing liquid LQ and a pump flow rate and an inert gas flow rate will be described below with reference back to FIG. 1. In this specification, the pump flow rate is a pumping flow rate of the processing liquid LQ in the pump 142 in the circulation pipe 141. In this embodiment, the pump flow rate is substantially a synonym with a "flow rate of the processing liquid LQ flowing in the circulation pipe 141." The pump flow rate represents a flow rate of the processing liquid LQ per unit time. The inert gas flow rate is a flow rate of the first inert gas GA1 supplied to the first gas supply pipe 21 in order to generate bubbles BB. The inert gas flow rate is represented by the flow rate of the first inert gas GA1 supplied to a single first gas supply pipe 21. The inert gas flow rate represents a flow rate of the first inert gas GA1 per unit time. This is true of the second inert gas GA2.

The dissolved oxygen concentration of the processing liquid LQ in the processing bath 105 has the following characteristics (1) to (3).

(1) When the first inert gas GA1 (bubbles BB) is not supplied to the processing liquid LQ in the processing bath 105, the dissolved oxygen concentration of the processing liquid LQ increases with the elapse of time. In this case, a rate of increase of the dissolved oxygen concentration of the processing liquid LQ decreases as the pump flow rate decreases. Characteristic (1) has been verified in Example 1 (FIG. 20) which will be described later.

(2) When the first inert gas GA1 (bubbles BB) is supplied to the processing liquid LQ in the processing bath 105, the dissolved oxygen concentration of the processing liquid LQ decreases with the elapse of time and converges on substantially a constant value. In this case, the dissolved oxygen concentration of the processing liquid LQ decreases as the pump flow rate decreases. A rate of decrease of the dissolved oxygen concentration of the processing liquid LQ increases as the pump flow rate decreases. Characteristic (2) has been verified in Example 2 (FIG. 21) which will be described later.

(3) When the first inert gas GA1 (bubbles BB) is supplied to the processing liquid LQ in the processing bath 105, the dissolved oxygen concentration of the processing liquid LQ decreases with the elapse of time and converges on substantially a constant value. In this case, the dissolved oxygen concentration of the processing liquid LQ decreases as the inert gas flow rate increases. A rate of decrease of the dissolved oxygen concentration of the processing liquid LQ increases as the inert gas flow rate decreases. Characteristic (3) has been verified in Example 3 (FIG. 22) which will be described later.

In this embodiment, preferably, the control unit 221 performs control based on Characteristics (1) to (3) for the dissolved oxygen concentration. In this case, as illustrated in FIG. 1, the control unit 221 includes a first control unit A1, a second control unit A2, and a third control unit A3. Specifically, the processor of the control unit 221 serves as the first to third control units A1 to A3 by executing a computer program stored in the storage device of the storage unit 223. The first control unit A1 controls the gas flow rate adjusting unit 180. The second control unit A2 controls the pump 142. The third control unit A3 controls the second gas supply unit 210 (specifically, the valve 26).

Figure 12:
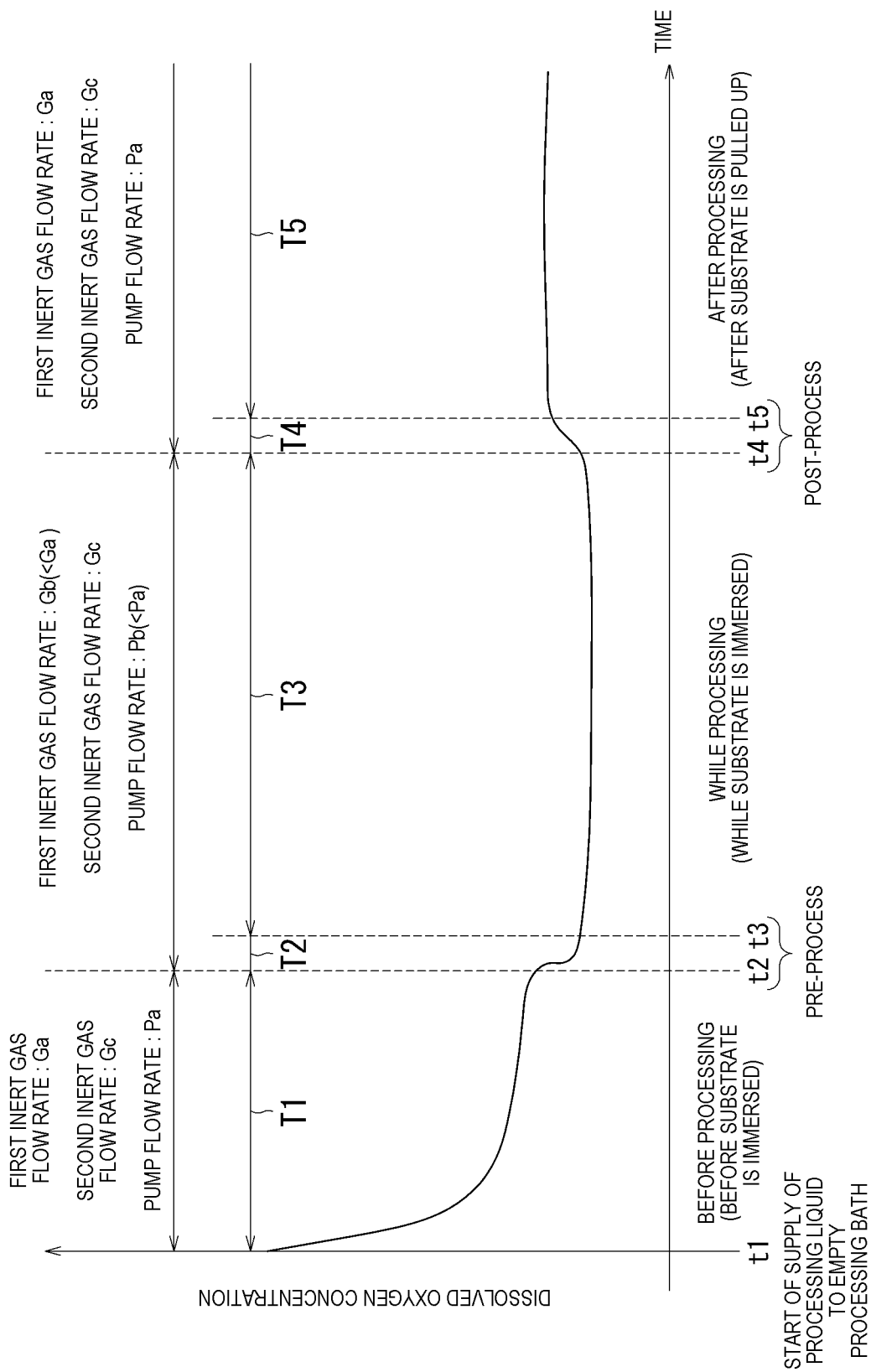
FIG. 12 is a diagram illustrating control of a dissolved oxygen concentration of the processing liquid in a processing bath according to the embodiment.

FIG. 12 is a diagram illustrating control of the dissolved oxygen concentration of the processing liquid LQ in the processing bath 105. In FIG. 12, the horizontal axis represents time, and the vertical axis represents the dissolved oxygen concentration of the processing liquid LQ.

As illustrated in FIG. 12, at time t1, the processing liquid supply unit 150 (FIG. 7) starts supply of the processing liquid LQ to the empty processing bath 105 via the outer bath 110. Then, the processing liquid supply unit 150 stops supply of the processing liquid LQ when a predetermined amount of processing liquid LQ has been supplied.

A period from time t1 to time t2 is a period T1 before substrates W are processed (a period T1 before the substrates W are immersed in the processing liquid LQ). In the period T1, the flow rate of the first inert gas GA1 is "Ga (liter/min)." In the period T1, the flow rate of the second inert gas GA2 is "Gc (liter/min)." In the period T1, the pump flow rate (the pumping flow rate of the processing liquid LQ in the pump 142) is "Pa (liter/min)." The flow rate Ga of the first inert gas GA1 in the period T1 before substrates W are processed is higher than the flow rate Gb of the first inert gas GA1 in a pre-processing period T2 and a processing period T3.

A period from time t2 to time t3 is the pre-processing period T2. Pre-processing is a process in a predetermined period immediately before the substrates W are immersed in the processing liquid LQ (a preparation process). In the pre-processing period T2, the substrate holding unit 120 immerses the substrates W in the processing liquid LQ.

A period from time t3 to time t4 is a period T3 in which substrates W are being processed (a period T3 in which the substrates W are immersed in the processing liquid LQ). In the vicinity of the end of the period T3, the substrate holding unit 120 pulls up the substrates W from the processing liquid LQ. Pulling-up of the substrates W ends until time t4.

In the periods T2 and T3, the flow rate of the first inert gas GA1 is "Gb (liter/min)." In the periods T2 and T3, the flow rate of the second inert gas GA2 is "Gc (liter/min)." In the periods T2 and T3, the pump flow rate is "Pb (liter/min)."

The flow rate Gb of the first inert gas GA1 in the pre-processing period T2 and the processing period T3 is lower than the flow rate Ga in the period T1 before substrates W are processed, a post-processing period T4, and a period T5 after substrates W are processed. The pump flow rate Pb in the pre-processing period T2 and the processing period T3 is lower than the pump flow rate Pa in the period T1 before substrates W are processed, the post-processing period T4, and the period T5 after substrates W are processed. Preferably, the pump flow rate Pb in the pre-processing period T2 and the processing period T3 is zero.

A period from time t4 to time t5 is the post-processing period T4. Post-processing is a process in a predetermined period immediately after the substrates W have been pulled up from the processing liquid LQ.

A period substrate to time t5 is the period T5 after substrates W are processed (the period T5 after the substrates W are pulled up from the processing liquid LQ). That is, the period T5 is a standby period for processing substrates W of a next lot.

In the periods T4 and T5, the flow rate of the first inert gas GA1 is "Ga (liter/min)." In the periods T4 and T5, the flow rate of the second inert gas GA2 is "Gc (liter/min)." In the periods T4 and T5, the pump flow rate is "Pa (liter/min)." The flow rate Ga of the first inert gas GA1 in the post-processing period T4 and the period T5 after substrates W are processed is higher than the flow rate Gb of the first inert gas GA1 in the pre-processing period T2 and the processing period T3.

As described above with reference to FIG. 12, in this embodiment, the flow rate Ga of the first inert gas GA1 in the periods T1, T4, and T5 in which no substrates W are immersed in the processing liquid LQ is higher than the flow rate Gb of the first inert gas GA1 in the period T3 in which substrates W are immersed in the processing liquid LQ. In other words, the first control unit A1 controls the gas flow rate adjusting unit 180 such that the flow rate Ga of the first inert gas GA1 in the periods T1, T4, and T5 in which no substrates W are immersed in the processing liquid LQ is higher than the flow rate Gb of the first inert gas GA1 in the period T3 in which the substrates W are immersed in the processing liquid LQ.

As a result, particularly in the period T1, since the dissolved oxygen concentration of the processing liquid LQ in the processing bath 105 can be rapidly decreased (Characteristic (3) of the dissolved oxygen concentration), it is possible to shorten a period until processing of the substrates W is started. By increasing the flow rate Ga of the first inert gas GA1, it is possible to effectively curb dissolving of oxygen in the processing liquid LQ in the processing bath 105 in the periods T4 and T5 in addition to the period T1. In the periods T1, T4, and T5, since the substrates W are not immersed in the processing liquid LQ, positional misalignment of the substrates W due to bubbles BB of the first inert gas GA1 does not occur even when the flow rate Ga of the first inert gas GA1 is increased.

In the periods T1, T4, and T5 in which no substrates W are immersed in the processing liquid LQ, the first control unit A1 may control the gas flow rate adjusting unit 180 such that the flow rate Ga of the first inert gas GA1 is a maximum flow rate. In this case, particularly in the period T1, since the dissolved oxygen concentration of the processing liquid LQ in the processing bath 105 can be more rapidly decreased, it is possible to more shorten a period until processing of the substrates W is started. It is possible to more effectively curb dissolving of oxygen in the processing liquid LQ in the processing bath 105 in the periods T4 and T5 in addition to the period T1. Here, the maximum flow rate is a maximum flow rate of the first inert gas GA1 at which the first inert gas can be supplied by the gas flow rate adjusting unit 180.

In this embodiment, the pump flow rate Pb in the period T3 in which the substrates W are not immersed in the processing liquid LQ is lower than the pump flow rate Pa in the periods T1, T4, and T5 in which no substrates W are immersed in the processing liquid LQ. That is, the second control unit A2 controls the pump 142 such that the flow rate Pb of the processing liquid LQ flowing in the circulation pipe 141 in the period T3 in which the substrates W are immersed in the processing liquid LQ is lower than the flow rate Pa of the processing liquid LQ flowing in the circulation pipe 141 in the periods T1, T4, and T5 in which no substrates W are immersed in the processing liquid LQ.

As a result, in the period T3, since the dissolved oxygen concentration of the processing liquid LQ in the processing bath 105 can be effectively decreased (Characteristic (2) of the dissolved oxygen concentration), it is possible to increase the processing degree of the substrates W. Accordingly, it is possible to improve a throughput for processing the substrates W. In the period T3, the dissolved oxygen concentration of the processing liquid LQ is lower than that in the periods T1 and T5.

More preferably, the second control unit A2 stops the pump 142 in the period T3 in which the substrates W are immersed in the processing liquid LQ. As a result, in the period T3, it is possible to more effectively decrease the dissolved oxygen concentration of the processing liquid LQ in the processing bath 105 (Characteristic (2) of the dissolved oxygen concentration). Stopping of the pump 142 means that the flow rate of the processing liquid LQ in the circulation pipe 141 is zero.

In this embodiment, the pump flow rate Pa in the periods T1, T4, and T5 in which no substrates W are immersed in the processing liquid LQ is higher than the pump flow rate Pb in the period T3 in which the substrates W are immersed in the processing liquid LQ. That is, the second control unit A2 controls the pump 142 such that the flow rate Pa of the processing liquid LQ flowing in the circulation pipe 141 in the periods T1, T4, and T5 in which no substrates W are immersed in the processing liquid LQ is higher than the flow rate Pb in the period T3 in which the substrates W are immersed in the processing liquid LQ. As a result, it is possible to improve the filtering effect of the filter 144 in the periods T1, T4, and T5.

The pump flow rate Pa in the periods T1, T4, and T5 in which no substrates W are immersed in the processing liquid LQ may be a maximum flow rate. That is, the second control unit A2 may control the pump 142 such that the flow rate Pa of the processing liquid LQ flowing in the circulation pipe 141 in the periods T1, T4, and T5 in which no substrates W are immersed in the processing liquid LQ is the maximum flow rate. In this case, it is possible to further improve the filtering effect of the filter 144 in the periods T1, T4, and T5. Here, the maximum flow rate is a maximum flow rate of the processing liquid LQ which is pumpable by the pump 142.

When priority is given to the decrease of the dissolved oxygen concentration of the processing liquid LQ more than the filtering of the filter 144, the second control unit A2 sets the flow rate Pa of the processing liquid LQ in the periods T1, T4, and T5 to be higher than the flow rate Pb of the processing liquid LQ in the period T3 and to be lower than the maximum flow rate of the processing liquid LQ in the pump 142.

In this embodiment, the first control unit A1 controls the gas flow rate adjusting unit 180 such that the flow rate Gb of the first inert gas GA1 in the pre-processing period T2 is lower than the flow rate Ga of the first inert gas GA1 in the periods T1, T4, and T5 in which no substrates W are immersed in the processing liquid LQ. As a result, when the substrate holding unit 120 immerses the substrates W in the processing liquid LQ, it is possible to curb positional misalignment of the substrates W in the period T2.

In this embodiment, the pump flow rate Pb in the pre-processing period T2 is lower than the pump flow rate Pa in the periods T1, T4, and T5 in which no substrates W are immersed in the processing liquid LQ. That is, the second control unit A2 controls the pump 142 such that the flow rate Pb of the processing liquid LQ flowing in the circulation pipe 141 in the pre-processing period T2 is lower than the flow rate Pa of the processing liquid LQ flowing in the circulation pipe 141 in the periods T1, T4, and T5 in which no substrates W are immersed in the processing liquid LQ. In this case, it is possible to further decrease the dissolved oxygen concentration in the period T2.

In this embodiment, the flow rate Gc of the second inert gas GA2 supplied to the outer bath 110 is constant in the periods T1 to T5. That is, in the periods T1 to T5, the third control unit A3 sets the opening level of the valve 26 such that the flow rate Gc of the second inert gas GA2 is constant. As a result, in the periods T1 to T5, it is possible to stably curb dissolving of oxygen in the processing liquid LQ in the outer bath 110.

In this specification, the "flow rate of the processing liquid LQ flowing in the circulation pipe 141" may be replaced with the "pumping flow rate of the processing liquid LQ in the pump 142."

Figure 13:
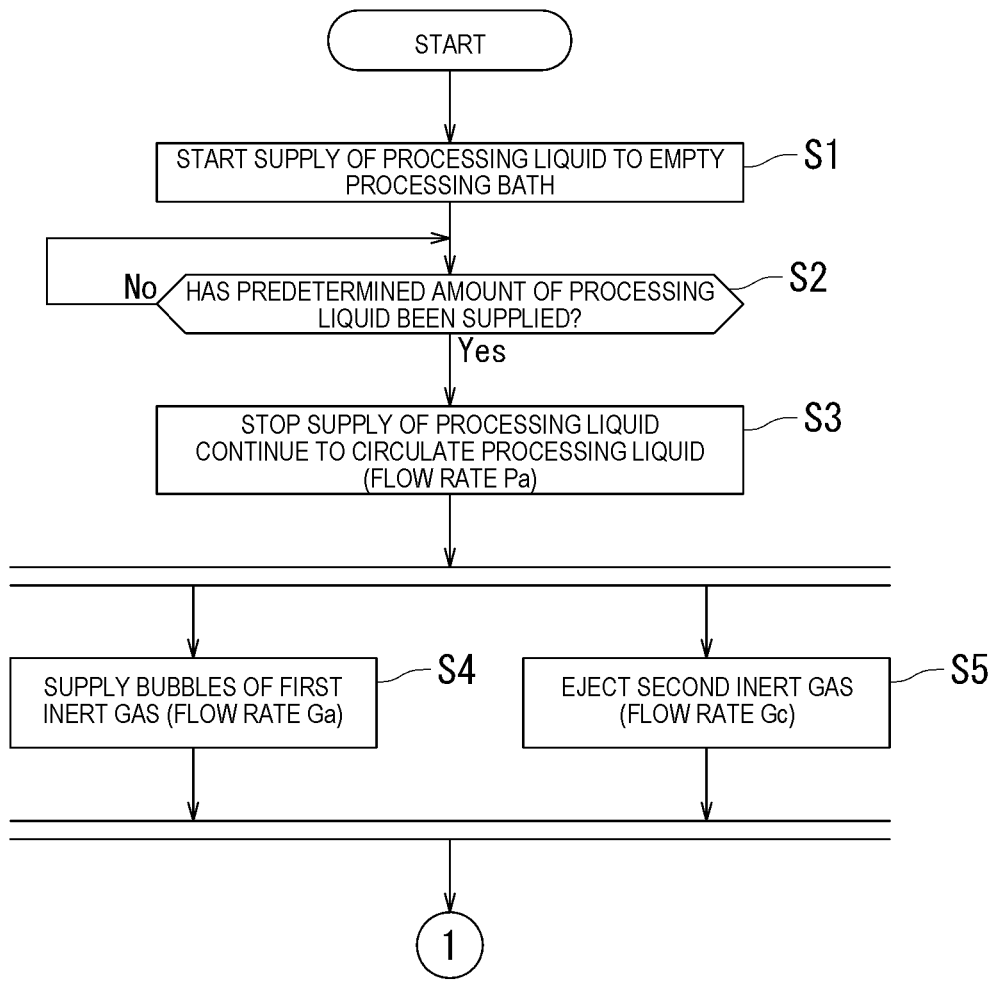
FIG. 13 is a flowchart illustrating a first half of a substrate processing method according to the embodiment.
Figure 14:
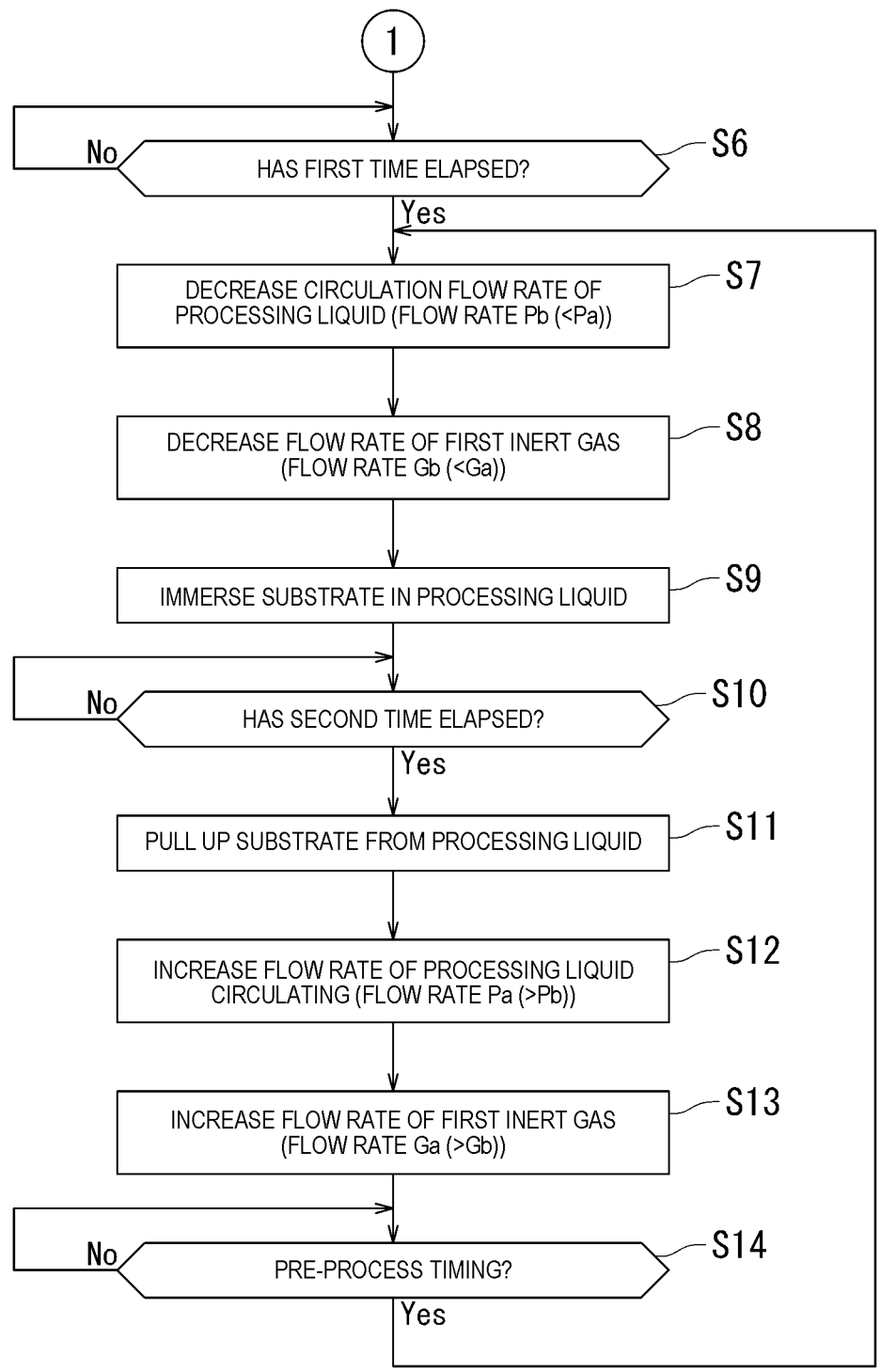
FIG. 14 is a flowchart illustrating a second half of the substrate processing method according to the embodiment.

A substrate processing method according to this embodiment will be described below with reference to FIG. 1 and FIGS. 13 to 15. The substrate processing method is performed by the substrate processing apparatus 100. FIGS. 13 and 14 are flowcharts illustrating an example of the substrate processing method according to this embodiment. As illustrated in FIGS. 13 and 14, the substrate processing method includes Steps S1 to S14.

As illustrated in FIGS. 1 and 13, first, in Step S1, the control unit 221 of the substrate processing apparatus 100 controls the processing liquid supply unit 150 (FIG. 7) and the processing liquid introduction unit 125 such that the processing liquid LQ is supplied to the empty processing bath 105. As a result, supply of the processing liquid LQ to the empty processing bath 105 is started. Specifically, the control unit 221 controls the processing liquid supply unit 150 such that the processing liquid LQ is supplied to the outer bath 110. The control unit 221 controls the processing liquid introduction unit 125 such that the processing liquid LQ is introduced into the processing bath 105 from the outer bath 110. In this case, the second control unit A2 of the control unit 221 sets the pumping flow rate of the processing liquid LQ in the pump 142 of the processing liquid introduction unit 125 to the flow rate Pa (liter/min).

Then, in Step S2, the control unit 221 determines whether a predetermined amount of processing liquid LQ has been supplied.

When it is determined in Step S2 that the predetermined amount of processing liquid LQ has not been supplied (No), the processing liquid LQ is continuously supplied until the predetermined amount of processing liquid LQ is supplied.

On the other hand, when it is determined in Step S2 that the predetermined amount of processing liquid LQ has been supplied (Yes), the routine proceeds to Step S3.

Then, in Step S3, the control unit 221 controls the processing liquid supply unit 150 such that supply of the processing liquid LQ is stopped. On the other hand, the processing liquid introduction unit 125 continues to introduce the processing liquid LQ into the processing bath 105 from the outer bath 110. Accordingly, the processing liquid LQ in the processing bath 105 circulates via the outer bath 110 and the circulation pipe 141. In this case, the flow rate of the processing liquid LQ in the pump 142 of the processing liquid introduction unit 125 is the flow rate Pa (liter/min).

Then, Step S4 and Step S5 are performed in parallel. Step S5 may be performed after Step S4 has been performed, or Step S5 may be performed before Step S4 is performed.

In Step S4, the first control unit A1 of the control unit 221 controls the gas flow rate adjusting unit 180 such that the first inert gas GA1 is supplied to the first gas supply pipes 21. As a result, each first gas supply pipe 21 supplies a lot of bubbles BB to the processing liquid LQ in the processing bath 105 by ejecting the first inert gas GA1 from the first ejection holes H1. In Step S4, the gas flow rate adjusting unit 180 sets the flow rate of the first inert gas GA1 to the flow rate Ga (liter/min). Step S4 corresponds to an example of a "first gas supply step of supplying the first inert gas GA1 to the processing liquid LQ stored in the processing bath 105" in the disclosure.

On the other hand, in Step S5, the third control unit A3 of the control unit 221 controls the valve 26 (FIG. 5) such that the second inert gas GA2 is supplied to the second gas supply pipes 25. As a result, each second gas supply pipe 25 ejects the second inert gas GA2 into the outer bath 110 from the second ejection holes H2. In Step S5, the valve 26 sets the flow rate of the second inert gas GA2 to the flow rate Gc (liter/min). Step S5 corresponds to an example of a "second gas supply step of supplying the second inert gas GA2 into the outer bath 110" in the disclosure.

Then, in Step S6, the control unit 221 determines whether a first time has elapsed after supply of the processing liquid LQ has stopped (Step S3) as illustrated in FIG. 14. The first time is determined on the basis of the dissolved oxygen concentration of the processing liquid LQ by experiment and/or by experience.

When it is determined in Step S6 that the first time has not elapsed (No), control stands by until the first time elapses.

On the other hand, when it is determined in Step S6 that the first time has elapsed (Yes), the routine proceeds to Step S7.

Then, in Step S7, the second control unit A2 controls the pump 142 such that the flow rate Pb of the processing liquid LQ flowing in the circulation pipe 141 is lower than the flow rate Pa (Step S3). That is, the second control unit A2 sets the pumping flow rate of the processing liquid LQ in the pump 142 to switch from the flow rate Pa (Step S3) to a flow rate Pb lower than the flow rate Pa.

Then, in Step S8, the first control unit A1 controls the gas flow rate adjusting unit 180 such that the flow rate Gb of the first inert gas GA1 supplied to the first gas supply pipes 21 is lower than the flow rate Ga (Step S4). As a result, an amount of bubbles BB supplied to the processing liquid LQ decreases.

Then, in Step S9, the control unit 221 controls the substrate holding unit 120 such that the substrates W are immersed in the processing liquid LQ. As a result, the substrate holding unit 120 immerses the substrates W in the processing liquid LQ.

Then, in Step S10, the control unit 221 determines whether a second time has elapsed after the substrates W have been immersed in the processing liquid LQ (Step S9). The second time is determined on the basis of a processing degree required for the substrates W by experiment and/or by experience.

When it is determined in Step S10 that the second time has not elapsed (No), control stands by until the second time elapses.

On the other hand, when it is determined in Step S10 that the second time has elapsed (Yes), the routine proceeds to Step S11.

Then, in Step S11, the control unit 221 controls the substrate holding unit 120 such that the substrates W are pulled up from the processing liquid LQ. As a result, the substrate holding unit 120 pulls up the substrates W from the processing liquid LQ.

Then, in Step S12, the second control unit A2 controls the pump 142 such that the flow rate Pa of the processing liquid LQ flowing in the circulation pipe 141 is higher than the flow rate Pb (Step S7). That is, the second control unit A2 sets the pumping flow rate of the processing liquid LQ in the pump 142 to switch from the flow rate Pb (Step S7) to a flow rate Pa higher than the flow rate Pb.

Then, in Step S13, the first control unit A1 controls the gas flow rate adjusting unit 180 such that the flow rate Ga of the first inert gas GA1 supplied to the first gas supply pipes 21 is higher than the flow rate Gb (Step S8). As a result, the amount of bubbles BB supplied to the processing liquid LQ increases.

Then, in Step S14, the control unit 221 determines whether a pre-processing timing has come.

When it is determined in Step S14 that the pre-processing timing has not come (No), control stands by until the pre-processing timing comes.

On the other hand, when it is determined in Step S14 that the pre-processing timing has come (Yes), the routine proceeds to Step S7. Thereafter, Steps S7 to S14 are repeatedly performed.

As described above with reference to FIGS. 13 and 14, with the substrate processing method according to this embodiment, oxygen dissolved in the processing liquid LQ is replaced with the first inert gas GA1 by supplying the first inert gas GA1 (bubbles BB) to the processing liquid LQ in the processing bath 105 (Steps S4, S8, and S13). Accordingly, it is possible to decrease the dissolved oxygen concentration of the processing liquid LQ in the processing bath 105. As a result, it is possible to increase the processing degree of the substrates W using the processing liquid LQ. Particularly, since the second inert gas GA2 is supplied into the outer bath 110 (Step S5), it is possible to curb dissolving of oxygen in the processing liquid LQ in the outer bath 110. Accordingly, a processing liquid LQ with a lower dissolved oxygen concentration is introduced into the processing bath 105 from the outer bath 110 by the processing liquid introduction unit 125. As a result, it is possible to curb an "increase of the dissolved oxygen concentration of the processing liquid LQ in the processing bath 105 due to the processing liquid LQ introduced from the outer bath 110." Accordingly, it is possible to more effectively process the substrates W immersed in the processing liquid LQ using the processing liquid LQ. In this way, it is possible to improve the effectiveness of an inert gas and to effectively process substrates W.

Figure 15:
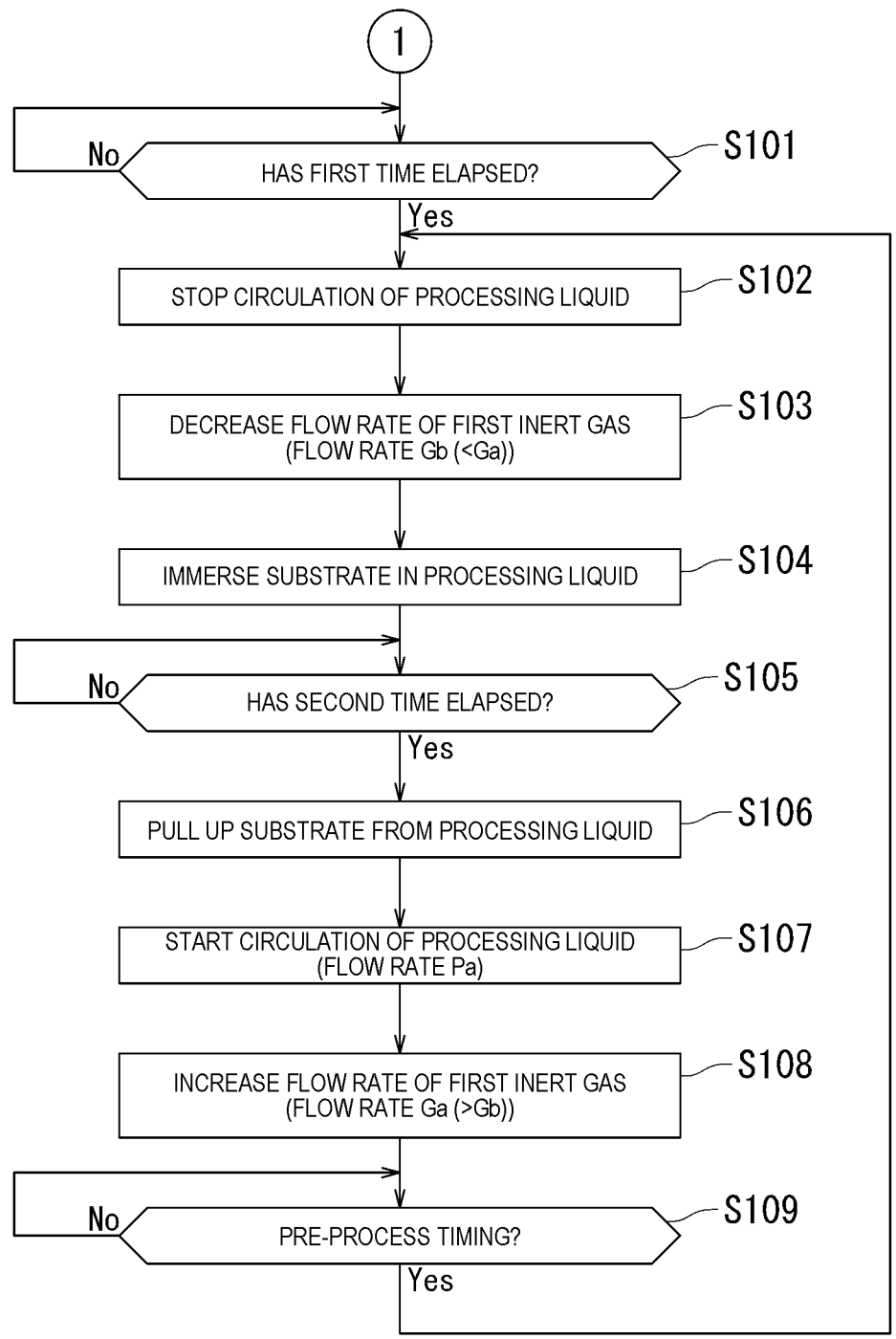
FIG. 15 is a flowchart illustrating a second half of another example of the substrate processing method according to the embodiment.

A more preferable example of the substrate processing method according to this embodiment will be described below with reference to FIGS. 1, 13, and 15. The first half of the substrate processing method in the more preferable example includes Steps S1 to S5 described above with reference to FIG. 13. FIG. 15 is a flowchart illustrating the second half of the more preferable example of the substrate processing method. As illustrated in FIG. 15, the second half of the substrate processing method includes Steps S101 to S109.

In Step S101, the control unit 221 determines whether a first time has elapsed after supply of a processing liquid LQ has stopped (Step S3).

When it is determined in Step S101 that the first time has not elapsed (No), control stands by until the first time elapses.

On the other hand, when it is determined in Step S101 that the first time has elapsed (Yes), the routine proceeds to Step S102.

Then, in Step S102, the second control unit A2 stops the pump 142. Accordingly, circulation of the processing liquid LQ in the circulation pipe 141 is stopped. That is, the flow rate of the processing liquid LQ in the circulation pipe 141 is zero. As a result, introduction of the processing liquid LQ from the outer bath 110 to the processing bath 105 stops.

Then, Steps S103 to S106 are performed. Steps S103 to S106 are the same as Steps S8 to S11 in FIG. 14.

Then, in Step S107, the second control unit A2 drives the pump 142. Accordingly, circulation of the processing liquid LQ in the circulation pipe 141 starts. As a result, introduction of the processing liquid LQ from the outer bath 110 to the processing bath 105 starts. In this case, the second control unit A2 sets the pumping flow rate of the processing liquid LQ in the pump 142 to the flow rate Pa (Step S3 in FIG. 13).

Then, in Step S108, the first control unit A1 controls the gas flow rate adjusting unit 180 such that the flow rate Ga of the first inert gas GA1 supplied to the first gas supply pipes 21 is higher than the flow rate Gb (Step S103). As a result, an amount of bubbles BB supplied to the processing liquid LQ is increased.

Then, in Step S109, the control unit 221 determines whether a pre-processing timing has come.

When it is determined in Step S109 that the pre-processing timing has not come (No), control stands by until the pre-processing timing comes.

On the other hand, when it is determined in Step S109 that the pre-processing timing has come (Yes), the routine proceeds to Step S102. Thereafter, Steps S102 to S109 are repeatedly performed.

As described above with reference to FIG. 15, in the preferable example of the substrate processing method, the pump 142 is stopped in the period in which the substrates W are immersed in the processing liquid LQ (Step S102). As a result, it is possible to more effectively decrease the dissolved oxygen concentration of the processing liquid LQ in the processing bath 105 while the substrates W are being processed.

First Modified Example

A first modified example of the embodiment will be described below with reference to FIGS. 16 and 17. The first modified example is different from the embodiment described above with reference to FIG. 1 in that a contact section 52X of the first lid member 111 is tilted. Hereinafter, differences of the first modified example from the embodiment will be mainly described.

Figure 16:
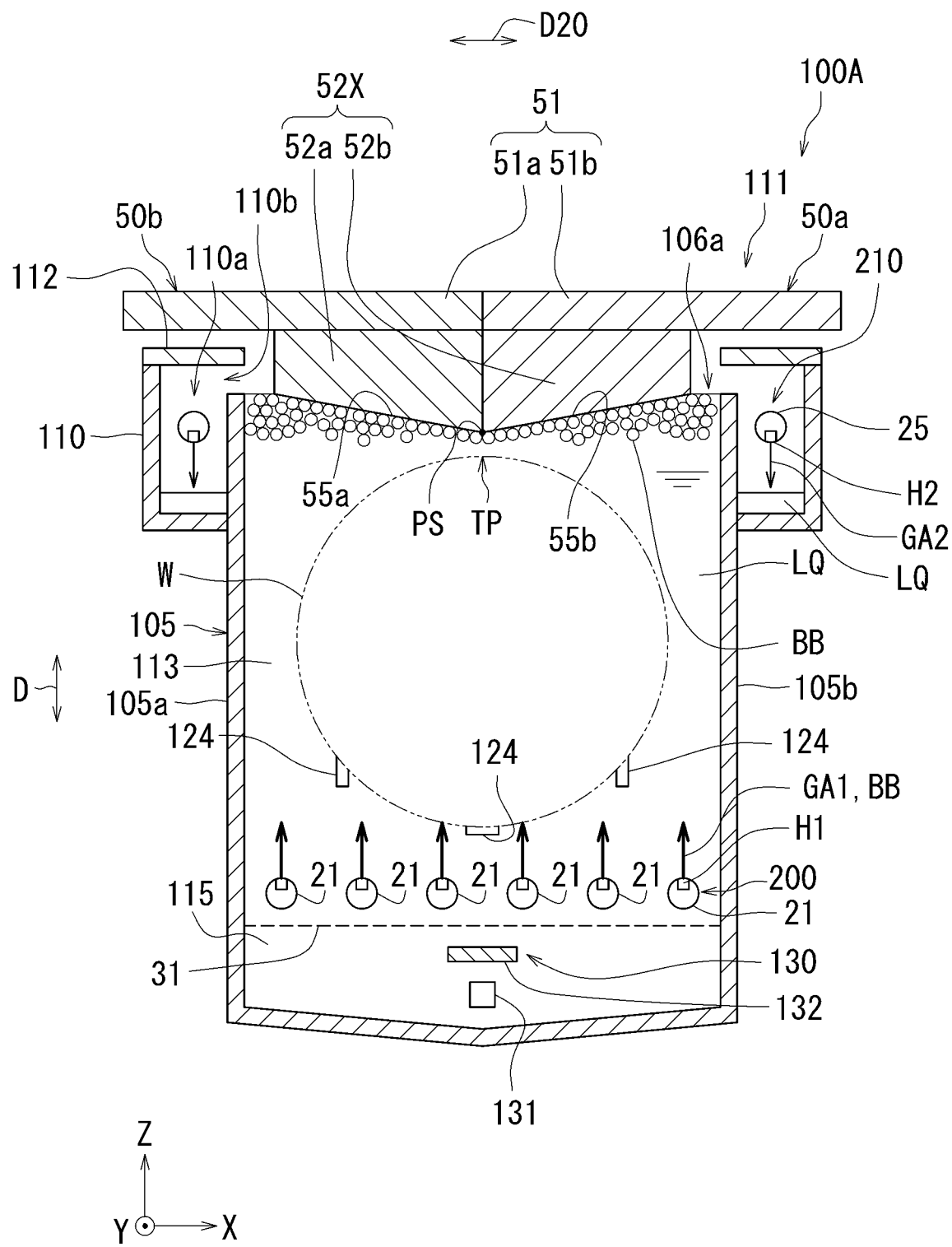
FIG. 16 is a sectional view schematically illustrating substrate processing apparatus according to a first modified example of the embodiment.
Figure 17:
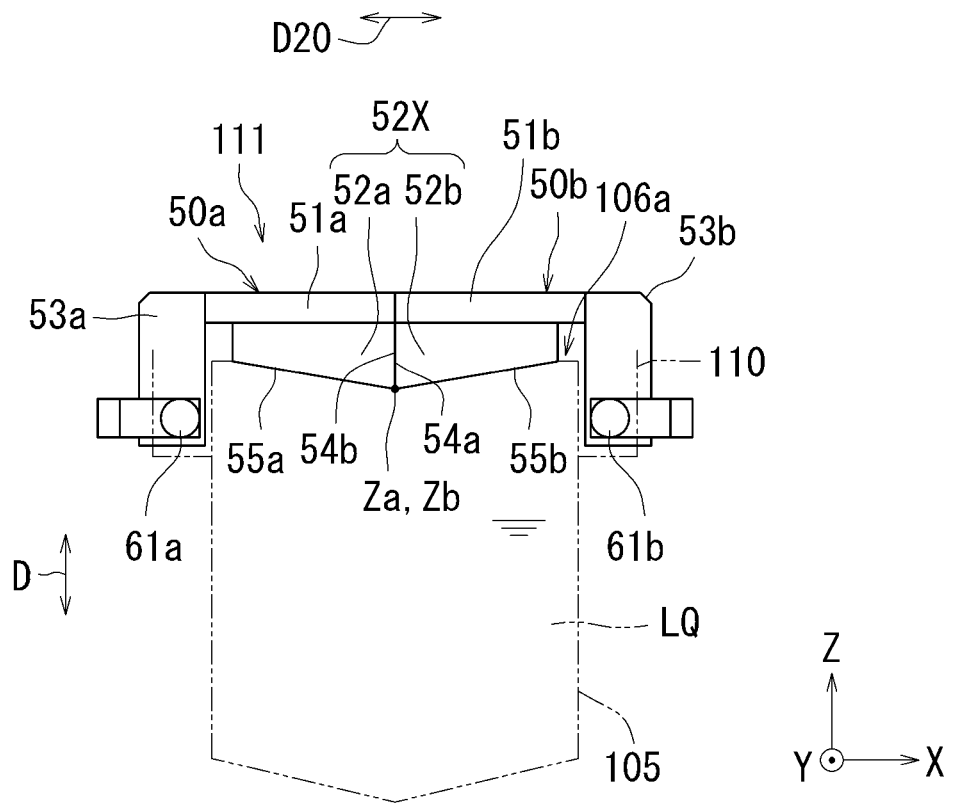
FIG. 17 is a view schematically illustrating a state in which a first lid member is closed according to the first modified example.

FIG. 16 is a sectional view schematically illustrating substrate processing apparatus 100A according to the first modified example. In FIG. 16, the substrate holding unit 120, the processing liquid introduction unit 125, the gas flow rate adjusting unit 180, and the control device 220 illustrated in FIG. 1 are omitted.

As illustrated in FIG. 16, the first lid member 111 of the substrate processing apparatus 100A includes a contact section 52X. In the state in which the first lid member 111 is closed, the contact section 52X is separated in the vertical direction D from a plurality of substrates W. In the state in which the first lid member 111 is closed, the contact section 52X is in contact with the processing liquid LQ in the processing bath 105 from above the processing liquid LQ in the processing bath 105.

Specifically, the contact section 52X includes a first tilted portion 55a and a second tilted portion 55b. More specifically, the first tilted portion 55a is the bottom of the first contact section 52a. The second tilted portion 55b is the bottom of the second contact section 52b.

The first tilted portion 55a is tilted obliquely upward to one side wall 105a of a pair of side walls 105a and 105b of the processing bath 105 from a position PS facing the tops TP of a plurality of substrates W in a state in which the upper opening 106a of the processing bath 105 is covered by the first lid member 111 (in the state in which the first lid member 111 is closed). That is, the first tilted portion 55a is tilted obliquely upward to one side wall 105a from the lowest portion of the contact section 52X in the state in which the upper opening 106a of the processing bath 105 is covered by the first lid member 111. Accordingly, bubbles BB arriving at the liquid surface of the processing liquid LQ gather on the side wall 105a along the first tilted portion 55a based on buoyancy. As a result, it is possible to prevent bubbles BB arriving at the liquid surface from gathering in the vicinity of the position PS.

The second tilted portion 55b is tilted obliquely upward to the other side wall 105b of the pair of side walls 105a and 105b from the position PS facing the tops TP of the plurality of substrates W in the state in which the upper opening 106a of the processing bath 105 is covered by the first lid member 111 (in the state in which the first lid member 111 is closed). That is, the second tilted portion 55b is tilted obliquely upward to the other side wall 105a from the lowest portion of the contact section 52X in the state in which the upper opening 106a of the processing bath 105 is covered by the first lid member 111.

Accordingly, bubbles BB arriving at the liquid surface of the processing liquid LQ gathers on the side wall 105b along the second tilted portion 55b based on buoyancy. As a result, it is possible to prevent bubbles BB arriving at the liquid surface from gathering in the vicinity of the position PS.

As described above with reference to FIG. 16, according to the first modified example, it is possible to prevent bubbles BB arriving at the liquid surface from gathering in the vicinity of the position PS by providing the first tilted portion 55a and the second tilted portion 55b. As a result, it is possible to prevent the bubbles BB arriving at the liquid surface of the processing liquid LQ from coming into contact with the tops TP of the substrates W. Accordingly, it is possible to prevent processing in the vicinity of the tops TP of the substrates W from being hindered by the bubbles BB arriving at the liquid surface.

In the first modified example, the first contact section 52a and the second contact section 52b are immersed in the processing liquid LQ in the processing bath 105. Accordingly, it is possible to curb contact of the liquid surface of the processing liquid LQ with oxygen. As a result, it is possible to curb dissolving of oxygen in the processing liquid LQ.

A rotation mechanism of the first lid member 111 will be described below with reference to FIG. 17. FIG. 17 is a diagram schematically illustrating the state in which the first lid member 111 is closed. As illustrated in FIG. 17, the first rotation shaft 61a and the second rotation shaft 61b are located below a portion Za of the first hinged door unit 50a and a portion Zb of the second hinged door unit 50b in a state in which the first hinged door unit 50a and the second hinged door unit 50b are closed. As a result, since interference of the first hinged door unit 50a and the second hinged door unit 50b with each other is prevented, it is possible to smoothly open and close the first hinged door unit 50a and the second hinged door unit 50b.

The portion Za is the lowest portion of the first contact section 52a at the center in the second direction D20 of the contact section 52X in the state in which the first hinged door unit 50a and the second hinged door unit 50b are closed. That is, the portion Za is the lowest portion of the first tilted portion 55a. The portion Zb is the lowest portion of the second contact section 52b at the center in the second direction D20 of the contact section 52X in the state in which the first hinged door unit 50a and the second hinged door unit 50b are closed. That is, the portion Zb is the lowest portion of the second tilted portion 55b.

Second Modified Example

A second modified example of the embodiment will be described below with reference to FIGS. 18 and 19. The second modified example is different from the embodiment described above with reference to FIG. 1 in that the second gas supply unit 210 supplies the second inert gas GA2 upward. Hereinafter, differences of the second modified example from the embodiment will be mainly described.

Figure 18:
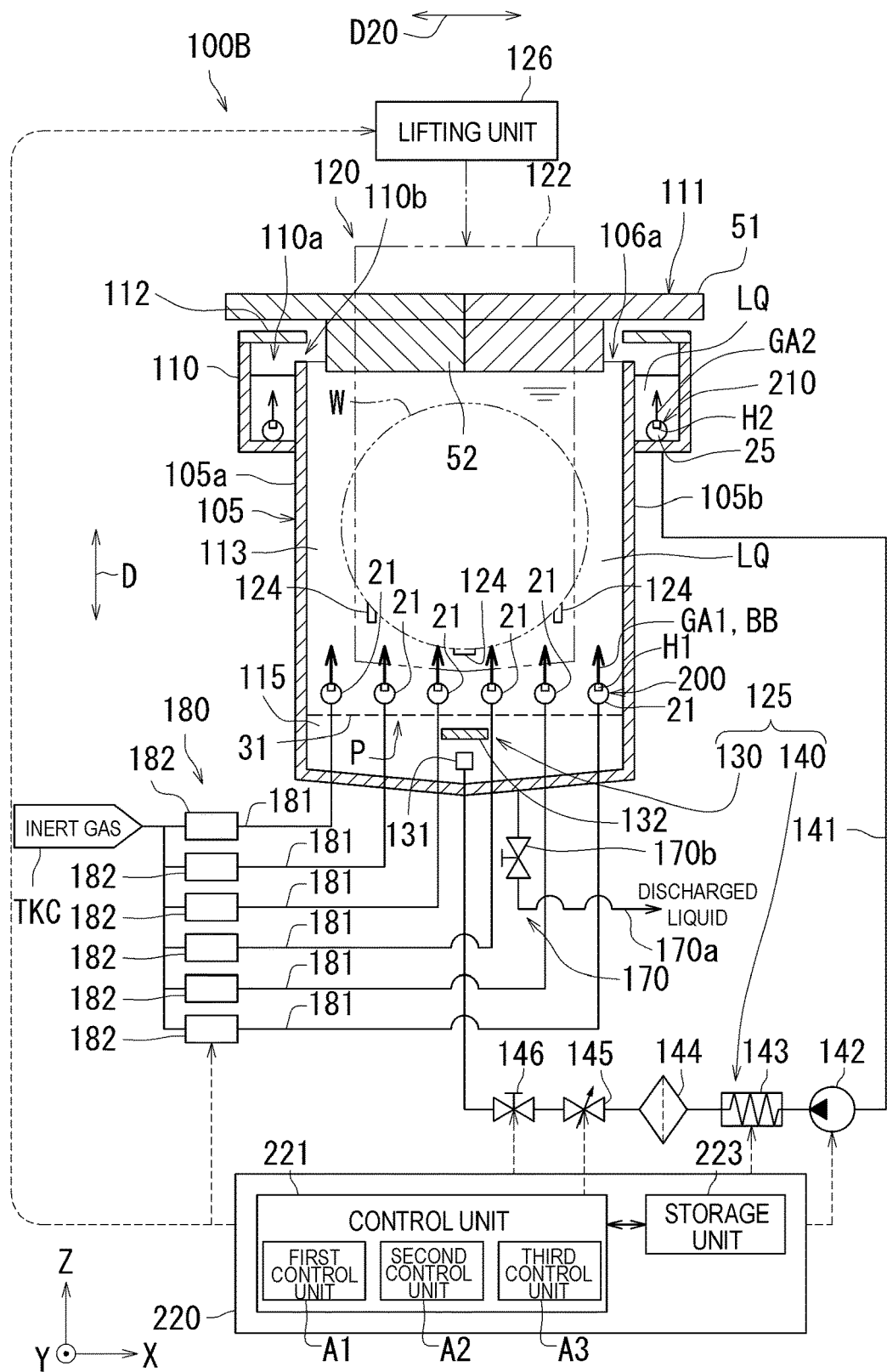
FIG. 18 is a sectional view schematically illustrating substrate processing apparatus according to a second modified example of the embodiment.

FIG. 18 is a sectional view schematically illustrating substrate processing apparatus 100B according to the second modified example. FIG. 19 is a sectional view schematically illustrating the outer bath 110 and the second gas supply pipes 25. In FIG. 19, the outer bath 110 and the second gas supply pipes 25 illustrated in the right part of FIG. 18 are cut by a plane parallel to the YZ plane of FIG. 18.

As illustrated in FIG. 18, in the substrate processing apparatus 100B, the second gas supply unit 210 is disposed inside of the outer bath 110 and ejects the second inert gas GA2 upward from the second ejection holes H2. Accordingly, it is possible to effectively curb dissolving of oxygen in the processing liquid LQ stored in the outer bath 110. This is because the second inert gas GA2 is likely to fill the outer bath 110. Preferably, the second gas supply unit 210 is disposed in the processing liquid LQ in the outer bath 110. In this case, it is possible to effectively decrease the dissolved oxygen concentration of the processing liquid LQ. "Upward" is, for example, upward in the vertical direction D (vertically upward).

Figure 19:
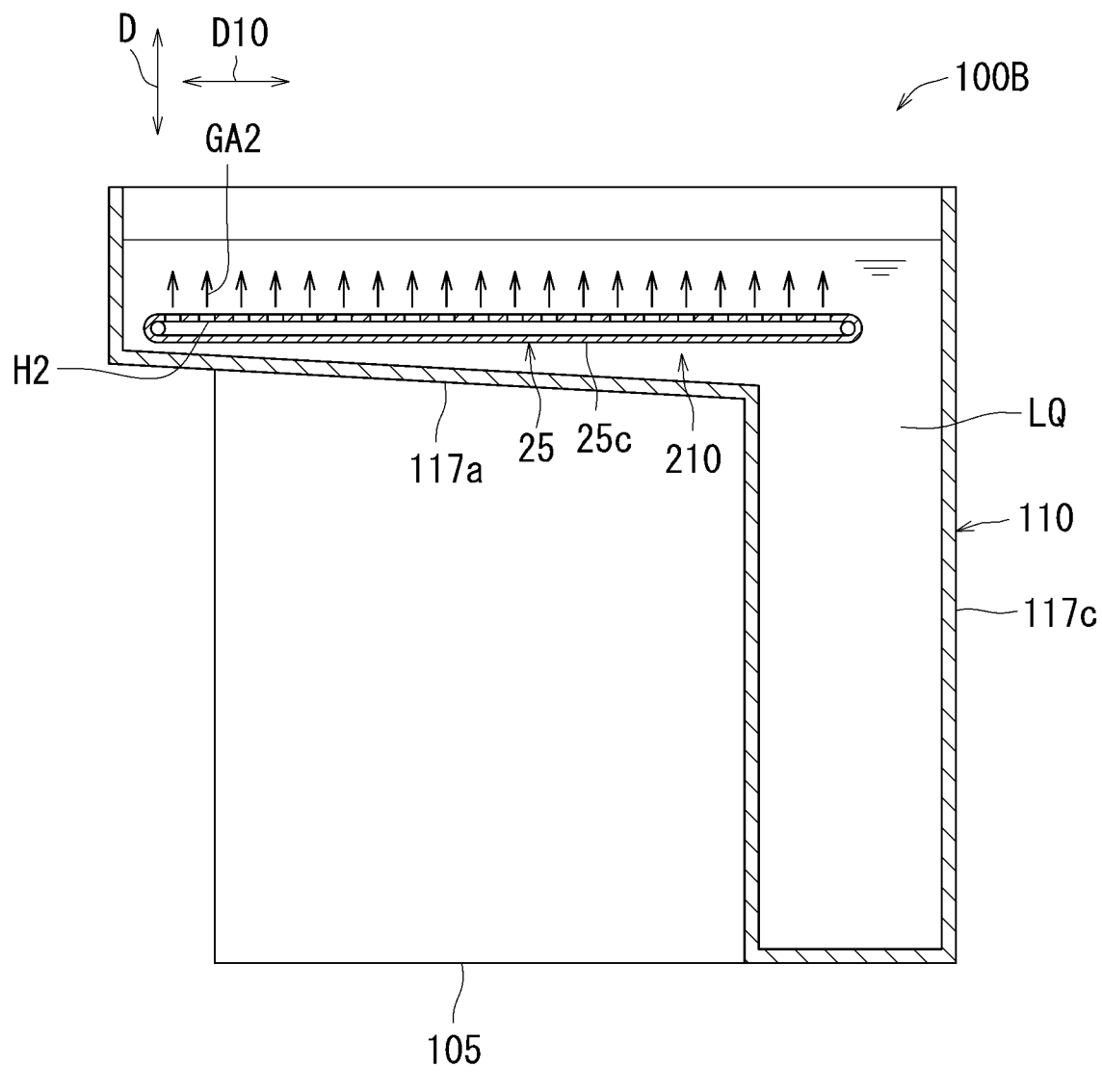
FIG. 19 is a sectional view schematically illustrating an outer bath and a second gas supply pipe according to the second modified example.

Specifically, as illustrated in FIG. 19, a plurality of second ejection holes H2 in each second gas supply pipe 25 are arranged substantially linearly with an interval in the first direction D10. The second gas supply pipes 25 are disposed inside of the outer bath 110 and eject the second inert gas GA2 upward from the second ejection holes H2. In this case, for example, the second ejection holes H2 faces upward in the vertical direction D. That is, the second ejection holes H2 are disposed on the top of each second gas supply pipe 25. Preferably, the second gas supply pipes 25 are disposed in the processing liquid LQ in the outer bath 110. Specifically, the second gas supply pipes 25 are disposed in the processing liquid LQ in the outer bath 110 on the bottom side of the first storage section 117a, on the bottom side of the second storage section 117b (FIG. 5), on the bottom side of the fourth storage section 117d (FIG. 5), and on the top side of the third storage section 117c of the outer bath 110.

The disclosure will be specifically described below with reference to examples, but the disclosure is not limited to the following examples.

EXAMPLES

In Example 1, Example 2, and Example 3 of the disclosure, the substrate processing apparatus 100 illustrated in FIG. 1 was used. For the purpose of simplifying a test system, the second gas supply unit 210 was not used.

TMAH was used as the processing liquid LQ. The first inert gas GA1 was nitrogen.

Example 1

In Example 1 of the disclosure, a temporal change of the dissolved oxygen concentration of the processing liquid LQ was measured without supplying the first inert gas GA1 (bubbles BB) to the processing liquid LQ for each pump flow rate (a pumping flow rate of the processing liquid LQ in the pump 142). Specifically, the flow rate of the first inert gas GA1 was 0 liter/min. That is, bubbles BB of the first inert gas GA1 were not supplied to the processing liquid LQ. This is because the number of variables was decreased for the purpose of measuring pump flow rate dependency of the dissolved oxygen concentration. The second inert gas GA2 was not used. This is because the test system in Example 1 was simplified for the purpose of measuring pump flow rate dependency of the dissolved oxygen concentration.

Figure 20:
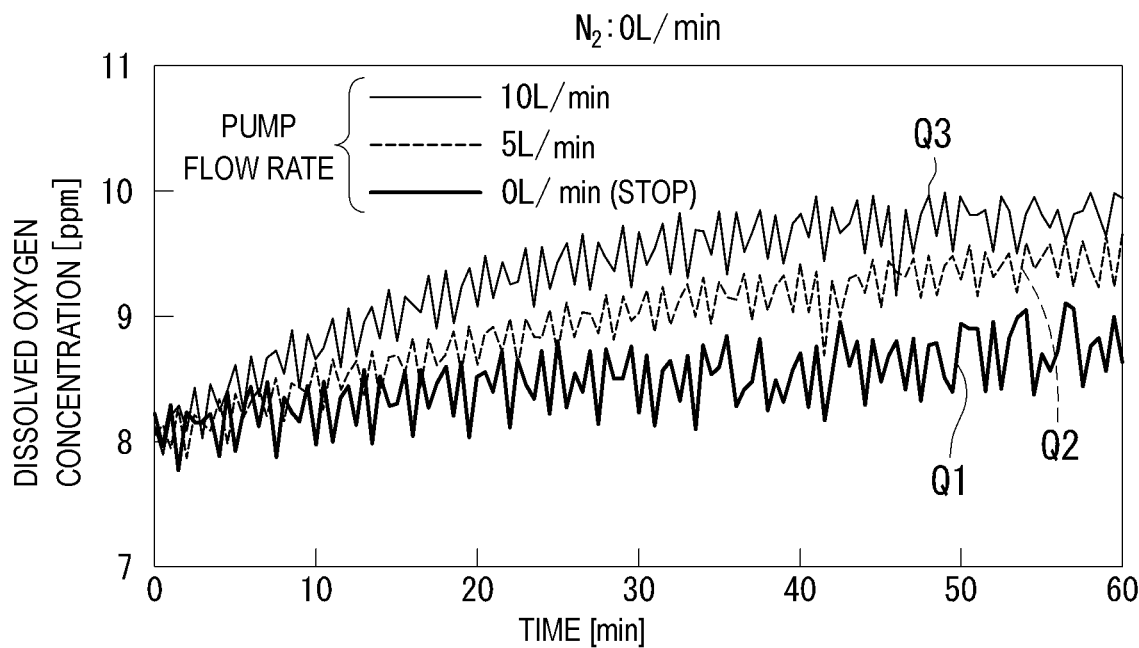
FIG. 20 is a graph illustrating a temporal change (without a first inert gas) of a dissolved oxygen concentration in a processing liquid according to Example 1 of the present disclosure.

FIG. 20 is a graph illustrating a temporal change (without the first inert gas GA1) of the dissolved oxygen concentration of the processing liquid LQ according to Example 1. The horizontal axis represents time (min) and the vertical axis represents the dissolved oxygen concentration (ppm) of the processing liquid LQ. In FIG. 20, a plot Q1 represents the temporal change of the dissolved oxygen concentration when the pump flow rate was 0 liter/min. That is, the plot Q1 represents the temporal change of the dissolved oxygen concentration in a state in which the pump 142 was stopped. A plot Q2 represents the temporal change of the dissolved oxygen concentration when the pump flow rate was 5 liter/min. A plot Q3 represents the temporal change of the dissolved oxygen concentration when the pump flow rate was 10 liter/min.

As illustrated in FIG. 20, in any of the plots Q1 to Q3, the dissolved oxygen concentration was increased with the elapse of time because oxygen in the atmosphere is dissolved in the processing liquid LQ. As can be understood from the plots Q1 to Q3, the rate of increase of the dissolved oxygen concentration was lower as the pump flow rate was lower. The reason can be estimated to be that oxygen in the atmosphere is less likely to be dissolved in the processing liquid LQ as the pump flow rate was lower.

Example 2

In Example 2 of the disclosure, a temporal change of the dissolved oxygen concentration of the processing liquid LQ was measured while supplying the first inert gas GA1 (bubbles BB) to the processing liquid LQ for each pump flow rate (a pumping flow rate of the processing liquid LQ in the pump 142). Specifically, the flow rate of the first inert gas GA1 was 10 liter/min. That is, Example 2 is also based on the purpose of ascertaining an effect of decreasing the dissolved oxygen concentration due to bubbles BB of the first inert gas GA1. The flow rate of the first inert gas GA1 represented the flow rate of the first inert gas supplied to a single first gas supply pipe 21. The second inert gas GA2 was not used. This is because the test system in Example 2 was simplified for the purpose of measuring pump flow rate dependency of the dissolved oxygen concentration.

Figure 21:
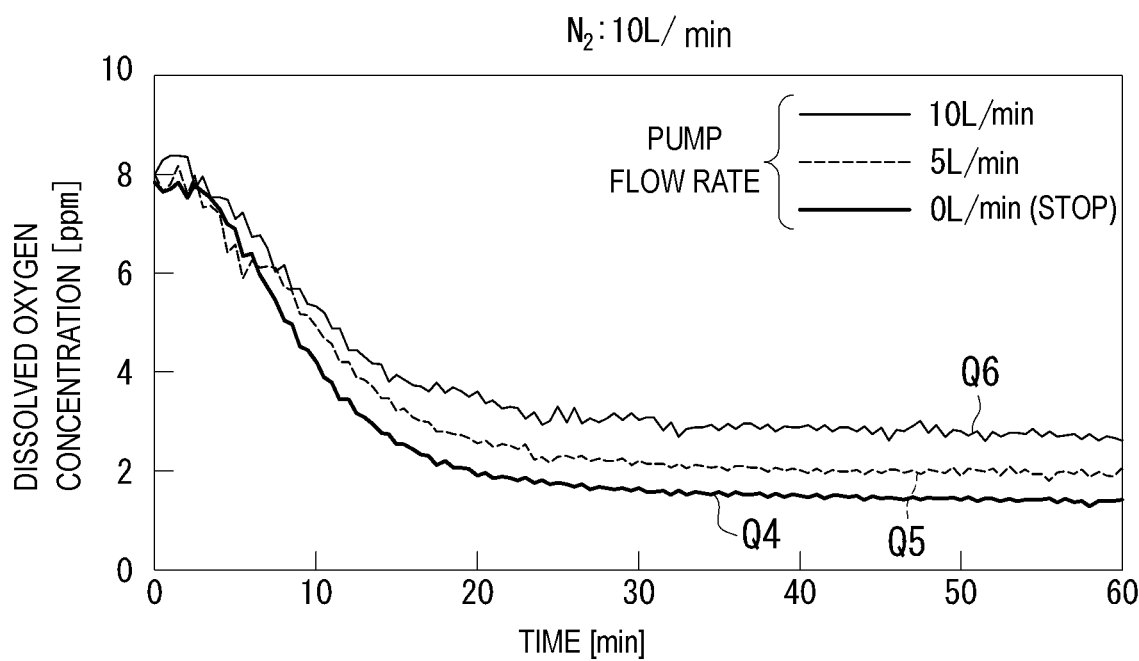
FIG. 21 is a graph illustrating a temporal change (with a first inert gas) of a dissolved oxygen concentration in a processing liquid according to Example 2 of the present disclosure.

FIG. 21 is a graph illustrating a temporal change (with the first inert gas GA1) of the dissolved oxygen concentration of the processing liquid LQ according to Example 2. The horizontal axis represents time (min) and the vertical axis represents the dissolved oxygen concentration (ppm) of the processing liquid LQ. In FIG. 21, a plot Q4 represents the temporal change of the dissolved oxygen concentration when the pump flow rate was 0 liter/min. That is, the plot Q4 represents the temporal change of the dissolved oxygen concentration in a state in which the pump 142 was stopped. A plot Q5 represents the temporal change of the dissolved oxygen concentration when the pump flow rate was 5 liter/min. A plot Q6 represents the temporal change of the dissolved oxygen concentration when the pump flow rate was 10 liter/min.

As illustrated in FIG. 21, in any of the plots Q4 to Q6, the dissolved oxygen concentration of the processing liquid LQ was decreased with the elapse of time due to bubbles BB of the first inert gas GA1. As can be understood from the plots Q4 to Q6, the rate of decrease of the dissolved oxygen concentration was higher as the pump flow rate was lower. The reason can be estimated to be that oxygen in the atmosphere is less likely to be dissolved in the processing liquid LQ as the pump flow rate was lower. As can be understood from the plots Q4 to Q6, the dissolved oxygen concentration of the processing liquid LQ converged on substantially a constant value with the elapse of time. In the state in which the dissolved oxygen concentration converted on substantially a constant value, the dissolved oxygen concentration of the processing liquid LQ was lower as the pump flow rate was lower.

Example 3

In Example 3 of the disclosure, a temporal change of the dissolved oxygen concentration of the processing liquid LQ was measured for each flow rate of the first inert gas GA1. The second inert gas GA2 was not used for the purpose of simplifying the test system. The pump flow rate (the pumping flow rate of the processing liquid LQ in the pump 142) was 23 liter/min.

Figure 22:
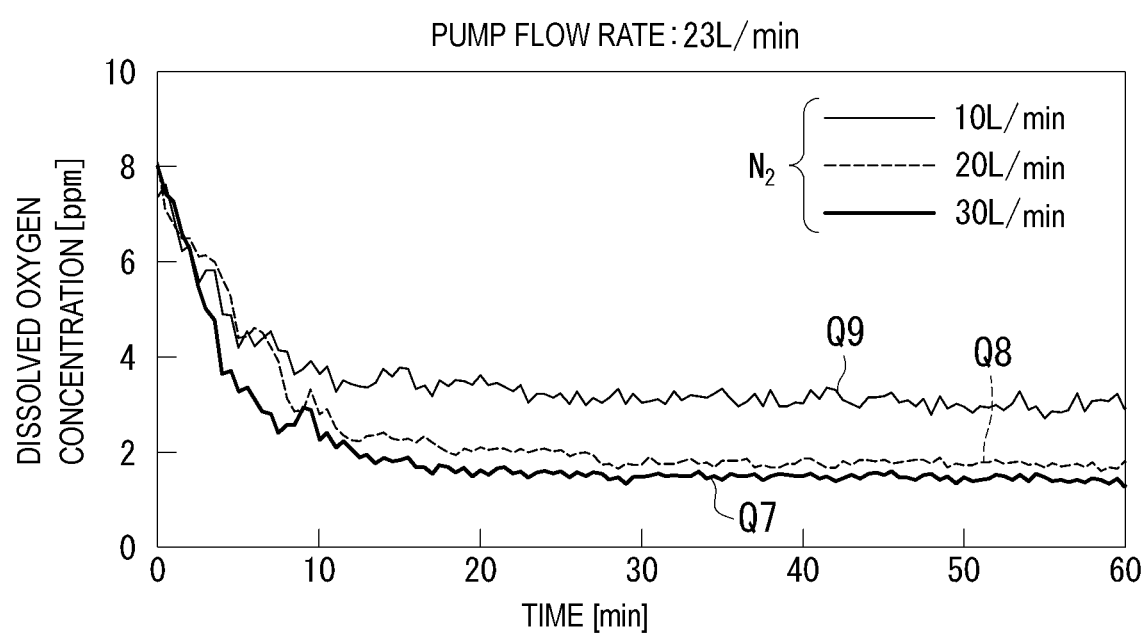
FIG. 22 is a graph illustrating a temporal change of a dissolved oxygen concentration in a processing liquid according to Example 3 of the present disclosure with respect to a flow rate of a first inert gas.

FIG. 22 is a graph illustrating a temporal change of the dissolved oxygen concentration of the processing liquid LQ according to Example 3 for each flow rate of the first inert gas GA1. The horizontal axis represents time (min) and the vertical axis represents the dissolved oxygen concentration (ppm) of the processing liquid LQ. In FIG. 22, a plot Q7 represents the temporal change of the dissolved oxygen concentration when the flow rate of the first inert gas GA1 was 30 liter/min. A plot Q8 represents the temporal change of the dissolved oxygen concentration when the flow rate of the first inert gas GA1 was 20 liter/min. A plot Q9 represents the temporal change of the dissolved oxygen concentration when the flow rate of the first inert gas GA1 was 10 liter/min. The flow rate of the first inert gas GA1 indicates a flow rate supplied to a single first gas supply pipe 21.

As illustrated in FIG. 22, in any of the plots Q7 to Q9, the dissolved oxygen concentration of the processing liquid LQ was decreased with the elapse of time due to bubbles BB of the first inert gas GA1. As can be understood from the plots Q7 to Q9, the rate of decrease of the dissolved oxygen concentration was higher as the flow rate of the first inert gas GA1 was high. The reason can be estimated to be that replacement of oxygen in the processing liquid LQ with the first inert gas GA1 is more promoted as the flow rate of the first inert gas GA1 was higher. As can be understood from the plots Q7 to Q9, the dissolved oxygen concentration of the processing liquid LQ converged on substantially a constant value with the elapse of time. In the state in which the dissolved oxygen concentration converted on substantially a constant value, the dissolved oxygen concentration of the processing liquid LQ was lower as the flow rate of the first inert gas GA1 was higher.

While an embodiment of the disclosure has been described above with reference to the drawings. The disclosure is not limited to the embodiment and can be modified in various forms without departing from the gist thereof. A plurality of elements described above in the embodiment can be appropriately replaced. For example, some elements out of all the elements disclosed in a certain embodiment may be added as elements of another embodiment or some elements out of all the elements of a certain embodiment may be deleted from the embodiment.

For the purpose of easy understanding of the disclosure with reference to the drawings, the drawings are schematically illustrated with elements as main components, and thicknesses, lengths, numbers, intervals, and the like of the illustrated elements may be different from actual ones for the purpose of easy preparation of the drawings. The configurations of the elements described in the embodiment are merely examples and are not particularly limited. The configurations can be modified in various forms without actually departing from the advantages of the disclosure.

(1) In FIG. 1, the gas flow rate adjusting mechanism 182 is provided for each of a plurality of first gas supply pipes 21. However, a single gas flow rate adjusting mechanism 182 may be shared by a plurality of first gas supply pipes 21.

(2) The number of first gas supply pipes 21 illustrated in FIG. 1 is not particularly limited and may be even or may be odd. Positions in the vertical direction D of the plurality of first gas supply pipes 21 may be aligned or may not be aligned. The direction of the first ejection holes H1 is not particularly limited, and may be, for example, an oblique upward direction, an oblique downward direction, the horizontal direction, or the vertically downward direction.

(3) In the second gas supply unit 210 illustrated in FIG. 5, a gas flow rate adjusting mechanism having the same configuration as the gas flow rate adjusting mechanism 182 (FIG. 10) may be provided instead of the valve 26. In this case, the gas flow rate adjusting mechanism adjusts the flow rate of the second inert gas GA2 under the control of the third control unit A3.

(4) The direction of the second ejection holes H2 in FIGS. 6 and 19 is not particularly limited, and may be, for example, an oblique upward direction, an oblique downward direction, or the horizontal direction.

What is claimed is:

1. A substrate processing apparatus comprising:
 a processing bath to store a processing liquid in which a substrate is immersed;
 a first lid member to cover an upper opening of the processing bath;
 an outer bath that is provided outside of the processing bath, and into which the processing liquid overflowing out of the processing liquid from the processing bath flows;
 a processing liquid introducer to introduce the processing liquid stored in the outer bath into the processing bath;
 a first gas supply to supply a first inert gas to the processing liquid stored in the processing bath; and
 a second gas supply to supply a second inert gas into the outer bath, wherein
 the second gas supply is provided in the outer bath and ejects the second inert gas upward, and
 the second gas supply is disposed in the processing liquid in the outer bath when the second gas supply supplies the second inert gas.

2. The substrate processing apparatus according to claim 1, further comprising a substrate holder to hold a plurality of substrates in a predetermined direction and immerse the plurality of substrates in the processing liquid stored in the processing bath,
 wherein the processing bath includes a pair of side walls extending in the predetermined direction,
 wherein the first lid member includes a contact section that comes into contact with the processing liquid,
 wherein the contact section is separated from the plurality of substrates, and
 wherein the contact section includes
  a first tilted portion that is tilted obliquely upward from a position facing a top of the plurality of substrates to one side wall of the pair of side walls in a state in which the first lid member covers the upper opening of the processing bath; and
  a second tilted portion that is tilted obliquely upward from the position facing the top of the plurality of substrates to the other side wall of the pair of side walls in the state in which the first lid member covers the upper opening of the processing bath.

3. The substrate processing apparatus according to claim 1, further comprising a second lid member covering an upper opening of the outer bath,
 wherein the first lid member covers the upper opening of the processing bath and the second lid member.

4. The substrate processing apparatus according to claim 1, wherein the processing liquid is alkaline.

5. A substrate processing apparatus comprising:
 a processing bath to store a processing liquid in which a substrate is immersed;
 a first lid member to cover an upper opening of the processing bath;
 an outer bath that is provided outside of the processing bath, and into which the processing liquid overflowing out of the processing liquid from the processing bath flows;
 a processing liquid introducer to introduce the processing liquid stored in the outer bath into the processing bath;
 a first gas supply to supply a first inert gas to the processing liquid stored in the processing bath;
 a second gas supply to supply a second inert gas into the outer bath;
 a gas flow rate adjuster to adjust a flow rate of the first inert gas; and
 a first controller to control the gas flow rate adjuster,
 wherein the first controller controls the gas flow rate adjuster such that the flow rate of the first inert gas in a period in which the substrate is not immersed in the processing liquid is higher than the flow rate of the first inert gas in an entire period in which the substrate is immersed in the processing liquid, and
 wherein the entire period in which the substrate is immersed in the processing liquid includes a first period in which the substrate is getting immersed in the processing liquid, and a second period extending for a duration in which the substrate is being processed by the processing liquid.

6. The substrate processing apparatus according to claim 5, wherein the second gas supply is provided in the outer bath and ejects the second inert gas downward.

7. The substrate processing apparatus according to claim 5, wherein the first controller controls the gas flow rate adjuster such that the flow rate of the first inert gas in the period in which the substrate is not immersed in the processing liquid is a maximum flow rate.

8. A substrate processing apparatus comprising:
a processing bath to store a processing liquid in which a substrate is immersed;
a first lid member to cover an upper opening of the processing bath;
an outer bath that is provided outside of the processing bath, and into which the processing liquid overflowing out of the processing liquid from the processing bath flows;
a processing liquid introducer to introduce the processing liquid stored in the outer bath into the processing bath;
a first gas supply to supply a first inert gas to the processing liquid stored in the processing bath; and
a second gas supply configured to supply a second inert gas into the outer bath,
wherein the processing liquid introducer includes:
   a pipe that connects the outer bath and the processing bath and in which the processing liquid flows; and
   a pump that pumps out the processing liquid from the outer bath to the processing bath via the pipe,
wherein the substrate processing apparatus further comprises a second controller to control the pump,
wherein the second controller controls the pump such that a flow rate of the processing liquid flowing in the pipe in an entire period in which the substrate is immersed in the processing liquid is less than a flow rate of the processing liquid flowing in the pipe in a period in which the substrate is not immersed in the processing liquid, and
wherein the entire period in which the substrate is immersed in the processing liquid includes a first period in which the substrate is getting immersed in the processing liquid, and a second period extending for a duration in which the substrate is being processed by the processing liquid.

9. The substrate processing apparatus according to claim 8, wherein the second controller stops the pump in the period in which the substrate is immersed in the processing liquid.

10. The substrate processing apparatus according to claim 8, wherein the second controller controls the pump such that the flow rate of the processing liquid flowing in the pipe in the period in which the substrate is not immersed in the processing liquid is a maximum flow rate.

11. The substrate processing apparatus according to claim 8, wherein the second gas supply is provided in the outer bath and ejects the second inert gas downward.

* * * * *